US010654717B2

(12) United States Patent
Boyd

(10) Patent No.: US 10,654,717 B2
(45) Date of Patent: May 19, 2020

(54) MEMS DEVICE

(71) Applicant: Cirrus Logic International Semiconductor Ltd., Edinburgh (GB)

(72) Inventor: Euan James Boyd, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 232 days.

(21) Appl. No.: 15/847,080

(22) Filed: Dec. 19, 2017

(65) Prior Publication Data

US 2018/0170749 A1 Jun. 21, 2018

Related U.S. Application Data

(60) Provisional application No. 62/436,600, filed on Dec. 20, 2016.

(30) Foreign Application Priority Data

Jan. 20, 2017 (GB) .................................. 1701013.3

(51) Int. Cl.
*B81C 99/00* (2010.01)
*B81B 7/00* (2006.01)
(Continued)

(52) U.S. Cl.
CPC .......... *B81C 99/004* (2013.01); *B81B 7/0006* (2013.01); *G01D 5/24* (2013.01);
(Continued)

(58) Field of Classification Search
CPC .... B81C 99/004; B81C 99/0045; G01D 5/24; G01R 31/2884; B81B 7/0006; B81B 2203/0127; B81B 2201/0257; B81B 2203/04; B81B 2203/0163; B81B 2207/07; B81B 2207/03; B81B 3/00; H04R 2201/003; H04R 29/004; H04R 19/005
See application file for complete search history.

(56) References Cited

U.S. PATENT DOCUMENTS 5,574,423 A * 11/1996 Vosika .................. G08B 29/10
340/332
6,192,749 B1 * 2/2001 Marek ................ G01F 25/0007
73/204.26
(Continued)

FOREIGN PATENT DOCUMENTS

EP 1897498 A1 3/2008
JP 2011174876 A 9/2011

OTHER PUBLICATIONS

International Search Report and Written Opinion of the International Searching Authority, International Application No. PCT/GB2017/053762, dated Feb. 8, 2018.
(Continued)

*Primary Examiner* — Daniel R Miller
(74) *Attorney, Agent, or Firm* — Jackson Walker L.L.P.

(57) ABSTRACT

A MEMS transducer, for instance a MEMS capacitive transducer, comprising: a flexible membrane, the flexible membrane comprising a conductive track; and a continuity testing circuit electrically connected to the conductive track. The conductive track may be electrically isolated from any further conductive regions of the flexible membrane. The continuity testing circuit is configured to test the continuity of the conductive track.

15 Claims, 17 Drawing Sheets

(51) Int. Cl.
*G01R 31/28* (2006.01)
*G01D 5/24* (2006.01)
*H04R 19/00* (2006.01)
*H04R 29/00* (2006.01)

(52) U.S. Cl.
CPC ....... *G01R 31/2884* (2013.01); *H04R 19/005* (2013.01); *B81B 2201/0257* (2013.01); *B81B 2203/0127* (2013.01); *B81B 2203/0163* (2013.01); *B81B 2203/04* (2013.01); *B81B 2207/03* (2013.01); *B81B 2207/07* (2013.01); *H04R 29/004* (2013.01); *H04R 2201/003* (2013.01)

(56) References Cited

U.S. PATENT DOCUMENTS

| | | |
|---|---|---|
| 6,359,458 B1 | 3/2002 | Yoshii |
| 6,847,907 B1 | 1/2005 | Novotny |
| 2010/0042820 A1* | 2/2010 | Clemm .................. G06F 15/177 713/2 |
| 2013/0234140 A1 | 9/2013 | Schiller et al. |
| 2014/0117910 A1* | 5/2014 | Le ........................... G01R 31/42 318/490 |
| 2015/0078592 A1* | 3/2015 | Uchida .................. H04R 19/04 381/191 |
| 2015/0253375 A1 | 9/2015 | Meinhold |

OTHER PUBLICATIONS

Examination Report under Section 18(3), UKIPO, Application No. GB1701013.3, dated Sep. 2, 2019.
Combined Search and Examination Report under Sections 17 and 18(3), UKIPO, Application No. GB1701013.3, dated Jun. 27, 2017.
Examination Report under Section 18(3), UKIPO, Application No. GB1701013.3, dated Apr. 23, 2019.

* cited by examiner

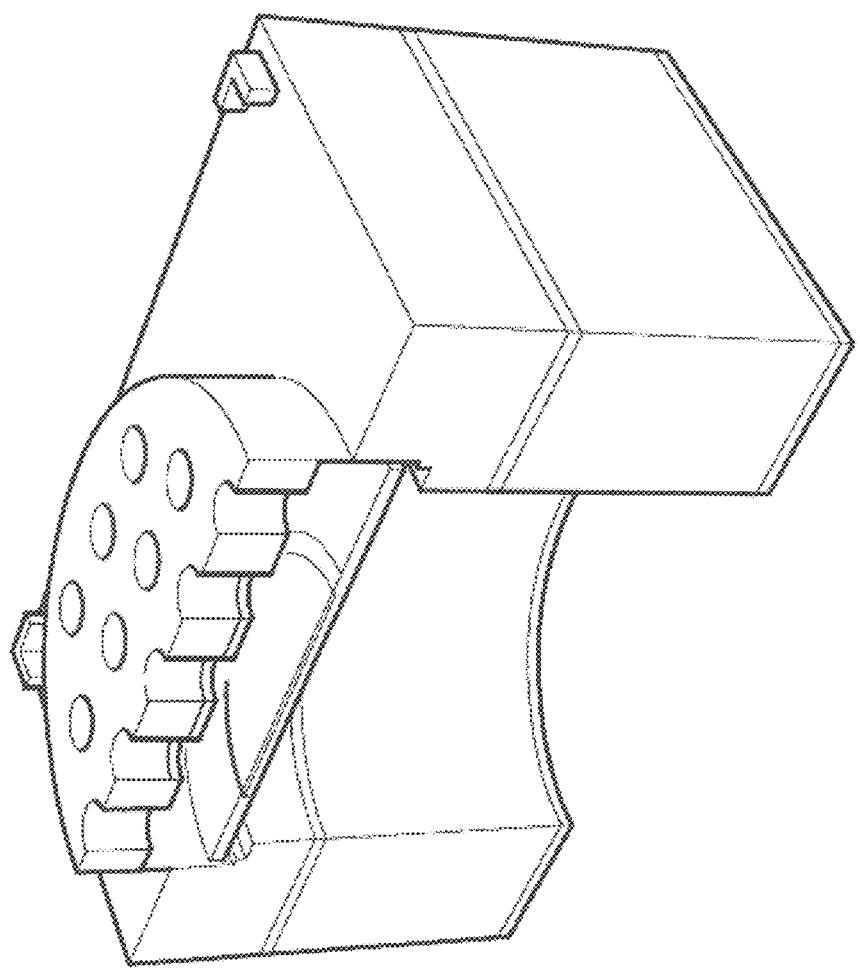

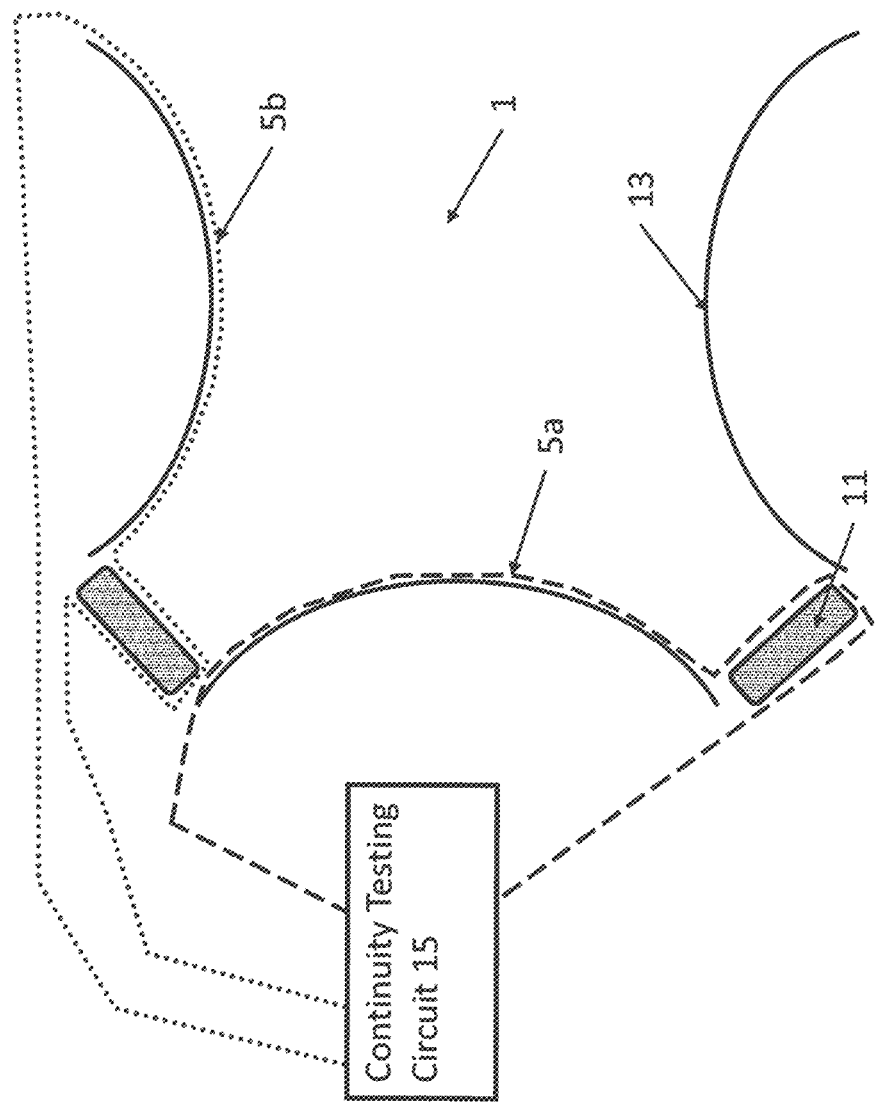

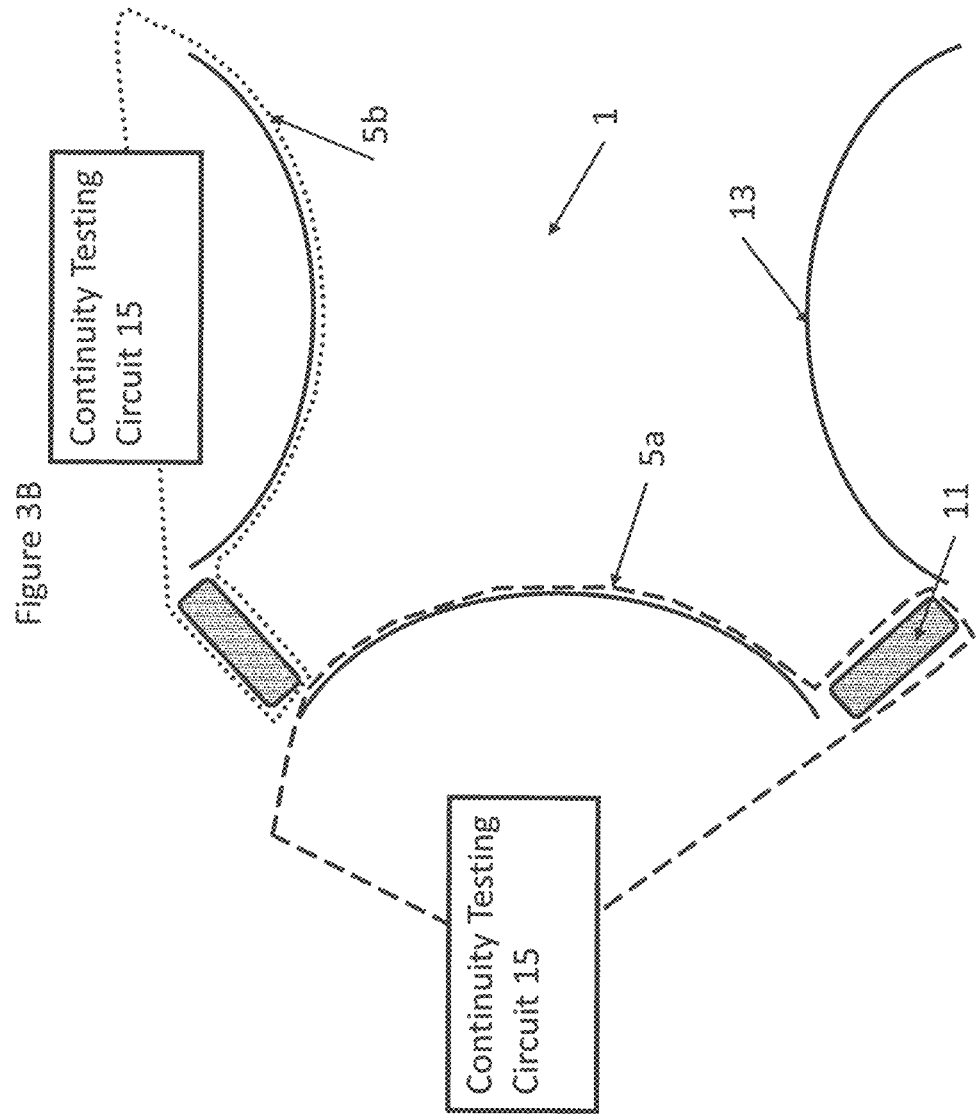

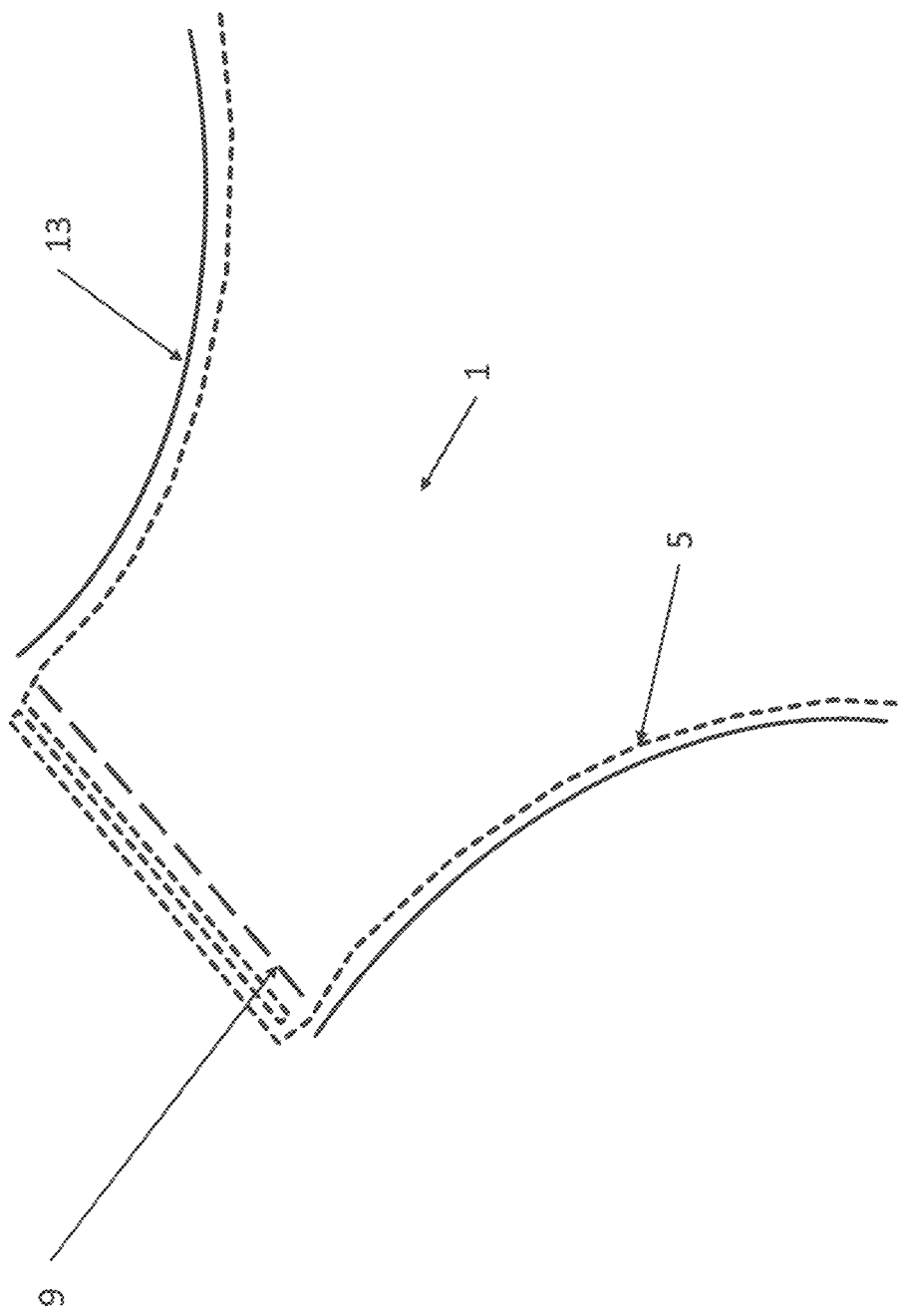

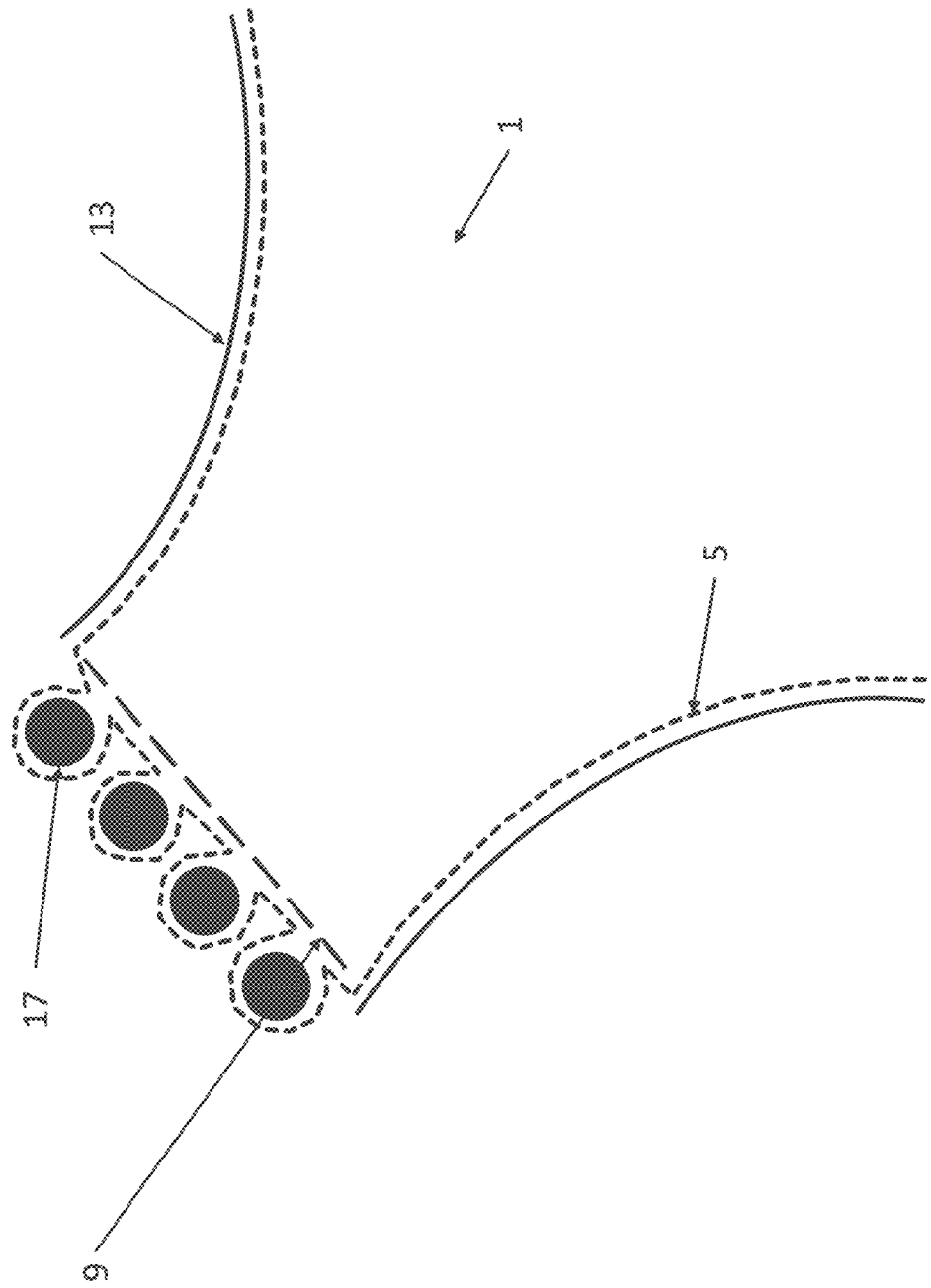

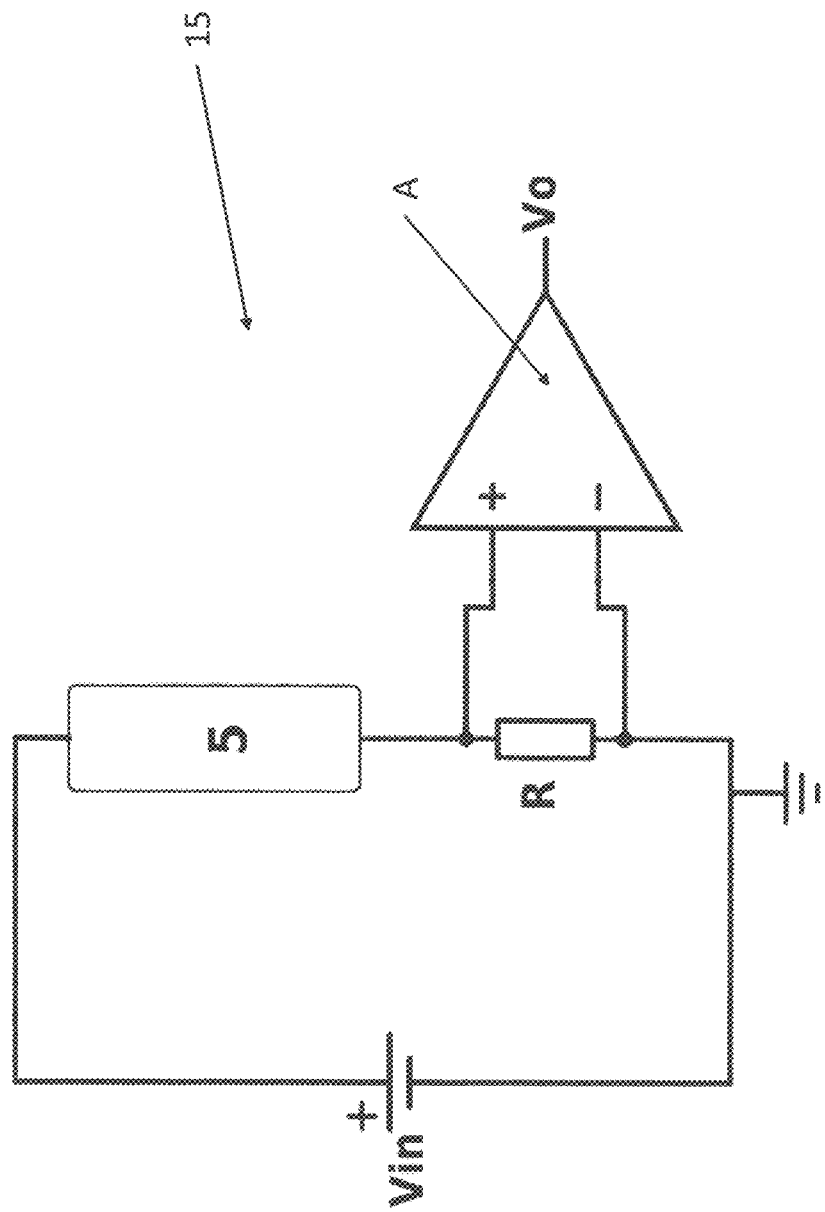

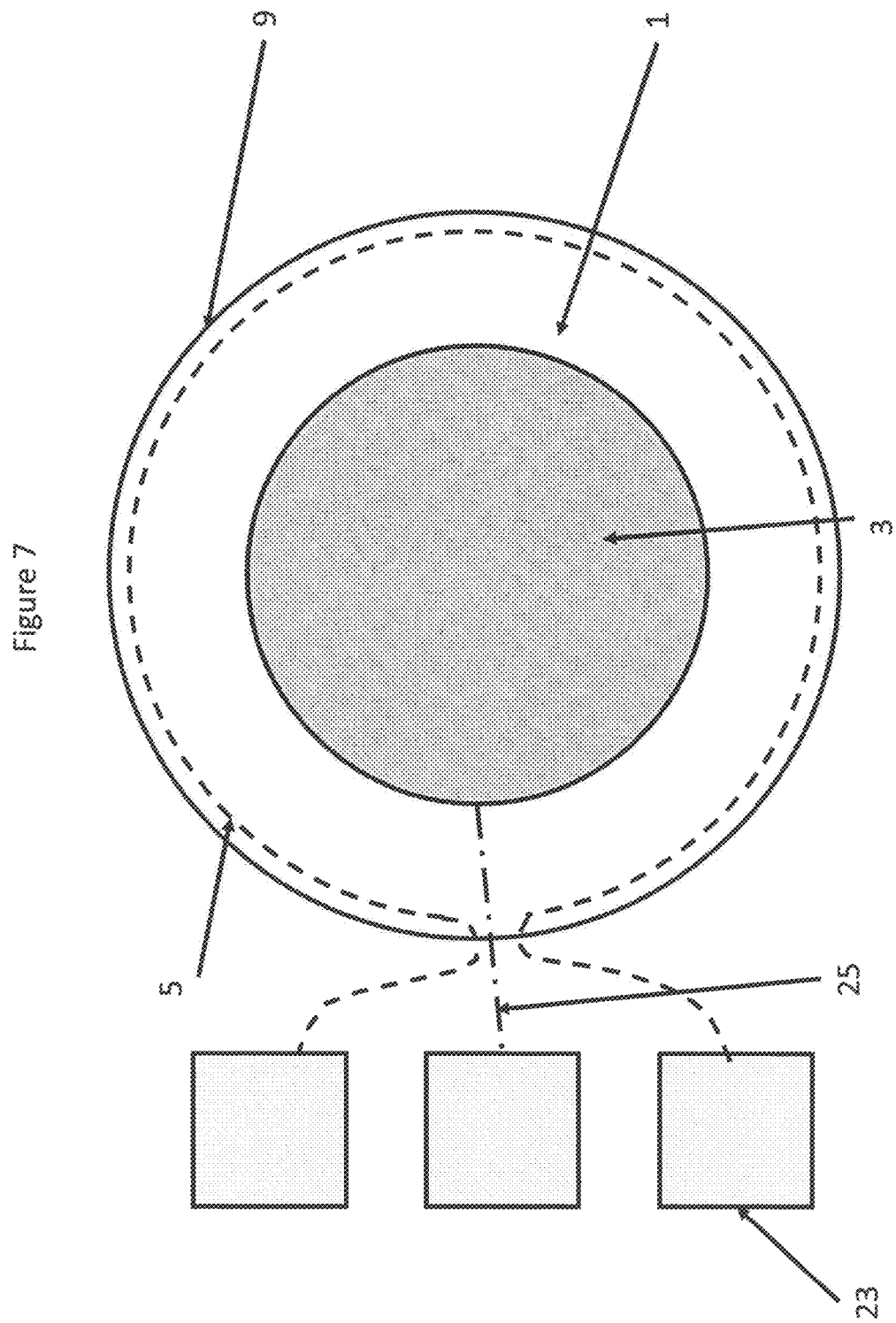

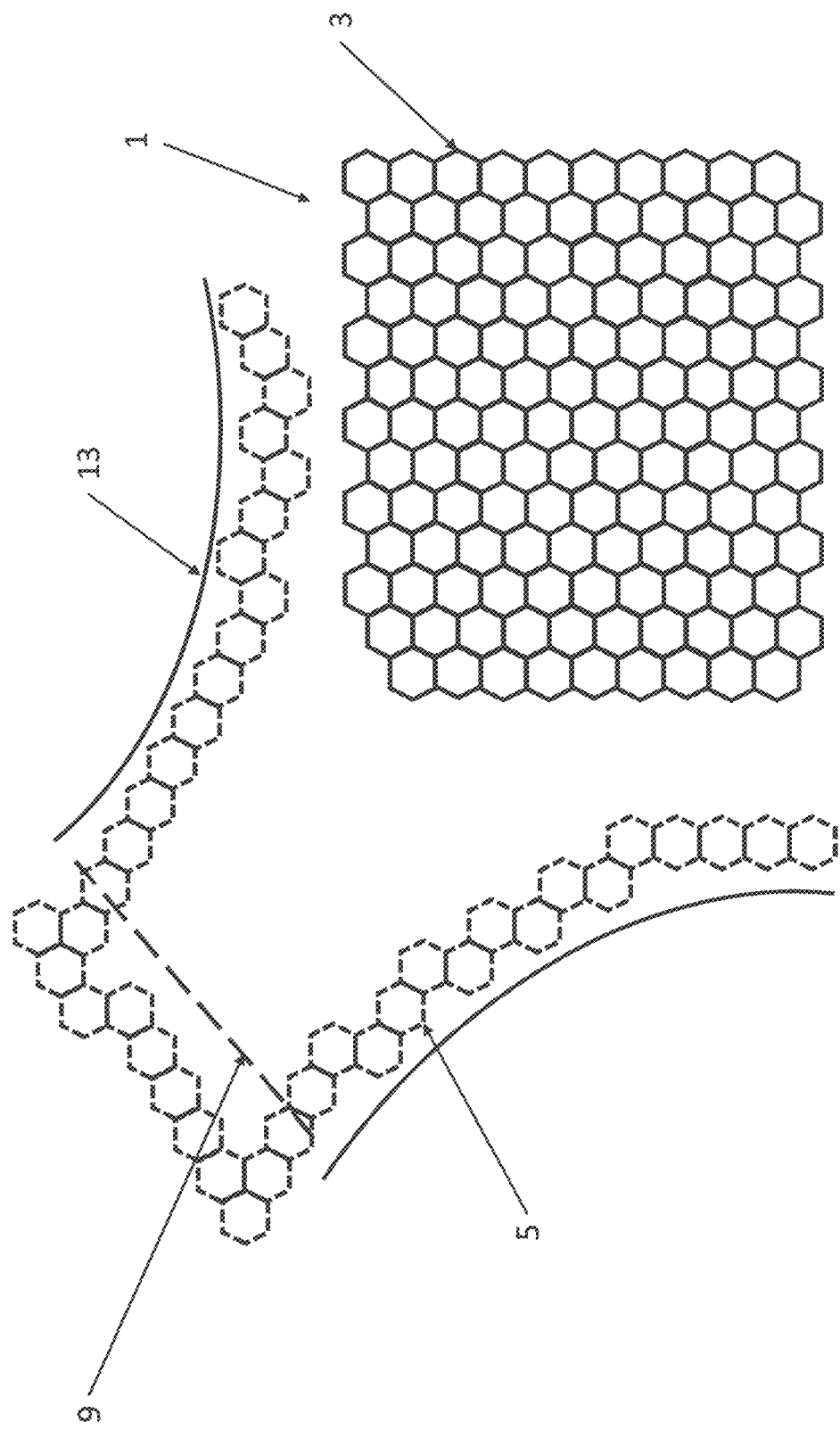

MEMS DEVICE

A micro-electro-mechanical system (MEMS) device, in particular a MEMS transducer for use as a capacitive microphone, the MEMS transducer comprising a flexible membrane and circuitry and structures for testing the status of the flexible membrane.

Various MEMS devices are becoming increasingly popular. MEMS transducers, and especially MEMS capacitive microphones, are prevalent in portable electronic devices such as mobile telephones and portable computing devices.

Microphone devices formed using MEMS fabrication processes typically comprise one or more membranes with electrodes for read-out/drive deposited on the membranes and/or a substrate. In the case of MEMS pressure sensors and microphones, the read out is usually accomplished by measuring the capacitance between a pair of electrodes which will vary as the distance between the electrodes changes in response to sound waves incident on the membrane surface.

FIGS. 1A and 1B show a schematic cross-sectional diagram and a perspective view, respectively, of a known capacitive MEMS microphone device 100. The capacitive microphone device 100 comprises a membrane layer 101 which forms a flexible membrane which is free to move in response to pressure differences generated by sound waves. A first electrode 102 is mechanically coupled to the flexible membrane, and together they form a first capacitive plate of the capacitive microphone device. A second electrode 103 is mechanically coupled to a generally rigid structural layer or back-plate 104, which together form a second capacitive plate of the capacitive microphone device. In the example shown in FIG. 1A the second electrode 103 is embedded within the back-plate structure 104.

The capacitive microphone is formed on a substrate 105, for example a silicon wafer which may have upper and lower oxide layers 106, 107 formed thereon. A cavity 108 in the substrate and in any overlying layers (hereinafter referred to as a substrate cavity) is provided below the membrane, and may be formed using a "back-etch" through the substrate 105. The substrate cavity 108 connects to a first cavity 109 located directly below the membrane. These cavities 108 and 109 may collectively provide an acoustic volume thus allowing movement of the membrane in response to an acoustic stimulus. Interposed between the first and second electrodes 102 and 103 is a second cavity 110.

The first cavity 109 may be formed using a first sacrificial layer during the fabrication process, i.e. using a material to define the first cavity which can subsequently be removed, and depositing the membrane layer 101 over the first sacrificial material. Formation of the first cavity 109 using a sacrificial layer means that the etching of the substrate cavity 108 does not play any part in defining the diameter of the membrane. Instead, the diameter of the membrane is defined by the diameter of the first cavity 109 (which in turn is defined by the diameter of the first sacrificial layer) in combination with the diameter of the second cavity 110 (which in turn may be defined by the diameter of a second sacrificial layer). The diameter of the first cavity 109 formed using the first sacrificial layer can be controlled more accurately than the diameter of a back-etch process performed using a wet-etch or a dry-etch. Etching the substrate cavity 108 will therefore define an opening in the surface of the substrate underlying the membrane 101.

A plurality of holes, hereinafter referred to as bleed holes 111, connect the first cavity 109 and the second cavity 110.

As discussed above the membrane may be formed by depositing at least one membrane layer 101 over a first sacrificial material. In this way the material of the membrane layer(s) may extend into the supporting structure, i.e. the side walls, supporting the membrane. The membrane and back-plate layer may be formed from substantially the same material as one another, for instance both the membrane and back-plate may be formed by depositing silicon nitride layers. The membrane layer may be dimensioned to have the required flexibility whereas the back-plate may be deposited to be a thicker and therefore more rigid structure. Additionally various other material layers could be used in forming the back-plate 104 to control the properties thereof. The use of a silicon nitride material system is advantageous in many ways, although other materials may be used, for instance MEMS transducers using polysilicon membranes are known.

In some applications, the microphone may be arranged in use such that incident sound is received via the back-plate. In such instances a further plurality of holes, hereinafter referred to as acoustic holes 112, are arranged in the back-plate 104 so as to allow free movement of air molecules, such that the sound waves can enter the second cavity 110. The first and second cavities 109 and 110 in association with the substrate cavity 108 allow the membrane 101 to move in response to the sound waves entering via the acoustic holes 112 in the back-plate 104. In such instances the substrate cavity 108 is conventionally termed a "back volume", and it may be substantially sealed.

In other applications, the microphone may be arranged so that sound may be received via the substrate cavity 108 in use. In such applications the back-plate 104 is typically still provided with a plurality of holes to allow air to freely move between the second cavity and a further volume above the back-plate.

It should also be noted that while FIGS. 1A and 1B show the back-plate 104 being supported on the opposite side of the membrane to the substrate 105, arrangements are known where the back-plate 104 is formed closest to the substrate with the membrane layer 101 supported above it.

In use, in response to a sound wave corresponding to a pressure wave being incident upon the microphone, the membrane is deformed slightly from its equilibrium or quiescent position. The distance between the membrane electrode 102 and the back plate electrode 103 is correspondingly altered, giving rise to a change in capacitance between the two electrodes that is subsequently detected by electronic circuitry (not shown). The bleed holes allow the pressure in the first and second cavities to equalise over a relatively long timescale (in acoustic frequency terms) which reduces the effect of low frequency pressure variations, e.g. arising from temperature variations and the like, but without impacting on sensitivity at the desired acoustic frequencies.

The flexible membrane layer of a MEMS transducer generally comprises a thin layer of a dielectric material—such as a layer of crystalline or polycrystalline material. The membrane layer may, in practice, be formed by several layers of material which are deposited in successive steps. The flexible membrane 101 may, for example, be formed from silicon nitride $Si_3N_4$ or polysilicon. Crystalline and polycrystalline materials have high strength and low plastic deformation, both of which are highly desirable in the construction of a membrane. The membrane electrode 102 of a MEMS transducer is typically a thin layer of metal, e.g. aluminium, which is typically located at least in the centre of the membrane 101, i.e. that part of the membrane which displaces the most. It will be appreciated by those skilled in the art that the membrane electrode may be formed by an alloy such as aluminium-silicon for example. Thus, known transducer membrane structures are composed of two layers of different material—typically a dielectric layer (e.g. SiN) and a conductive layer (e.g. AlSi).

In order to function, it is necessary for the membrane layer to be flexible, as discussed above. In particular, the flexible membrane layer should be configured to displace from an equilibrium position in response to an incident wave (wherein the incident wave may be a sound wave or another type of pressure wave). This is necessary such that the MEMS transducer can be used in a detecting role. However, it is not necessary for the entire flexible membrane area to be configured to deform (elastically) from an equilibrium position in response to an incident pressure wave. In alternative configurations, a perimeter region of the flexible membrane may provide the membrane flexibility, for example using a series of springs separated by perforations in the flexible membrane, while a central region of the flexible membrane may be more rigid. In flexible membrane configurations wherein the perimeter region contains a series of springs, the flexibility of the membrane that allows the membrane to deform in response to incident pressure waves is primarily provided by the springs, while the central region remains substantially undeformed.

The flexible nature of the flexible membrane (either over the entire flexible membrane area or concentrated in a perimeter region, as discussed above) necessarily results in a lower robustness for the flexible membrane than the back plate. This is because the back plate is not required to deform in response to incident pressure waves, and can therefore be formed as a robust, rigid structure. As a result of the necessary lower robustness of the flexible membrane, the flexible membrane can be susceptible to damage. Incident pressure waves above a certain threshold can cause damage to the flexible membrane when the MEMS transducer is in use. The flexible membrane can also be vulnerable to damage during the construction of the MEMS device, as the construction proves for the MEMS device may expose the flexible membrane to potentially damaging physical impacts, high energy radiation, chemical compounds, and so on. It is also possible, although unlikely, that a flexible membrane may be formed with an inherent weak point, for example, due to a poor deposition of part of the membrane during formation.

If a flexible membrane is damaged, the damage is likely to be in the form of a tear or puncture in the membrane. In extreme situations part or all of the flexible membrane may become detached from the remainder of the MEMS transducer, however it is more likely that the damage will take the form of a tear or puncture through the membrane which does not result in a portion of the flexible membrane becoming detached.

As discussed above, the MEMS transducers are commonly used as sensors in complicated electronic devices. A common use of the MEMS transducers is as microphones in mobile telephones or laptop computers. The MEMS transducers can be tailored to be particularly suitable for this role, by providing a microphone having a large sensing range and a low noise output in a small package. The small size facilitated by the use of MEMS transducers in microphones makes additional space available within the mobile telephone or laptop computer package, which can then be filled with further components.

As will be appreciated, the cost of a single MEMS transducer is negligible when compared to the total cost for a complicated electronic device (such as a mobile telephone or laptop computer). However, in the event that a microphone in a complicated electronic device is discovered to be faulty and requires replacement, the repair cost involved with replacing the microphone can be very high, due to the embedding of the microphone within the electronic device. This is true even if the faulty nature of the microphone is discovered by the manufacturer of the electronic device before the electronic device is shipped to a user. Accordingly, manufacturers of electronic devices often set stringent failure quotas for microphones (and other components), so as to avoid the expense of replacement. Manufacturers of MEMS transducers therefore may perform not only normal manufacturing performance testing on every part but also reliability testing of samples of parts from every batch to ensure that the failure rate of MEMS devices is acceptably low.

At least partially because it is required to be flexible, a component of MEMS transducers that can be prone to failure is the flexible membrane. Therefore, it is important to be able to test for the integrity of the flexible membrane in particular, both in reliability testing and manufacturing testing.

In reliability testing a packaged MEMS transducer may be subjected to a mechanical shock, such as simulated drop from height, or an acoustic shock, such as a high amplitude pressure pulse or other waveform. The device may then be subject to an operational test in which performance parameters such as acousto-electrical sensitivity or frequency response are measured and compared to pre-test values. Any significant change in pre- and post-test values may indicate a possible membrane failure. However change in performance may also be due to other component failure, e.g. circuit failure due to overload or electrostatic discharge (ESD). Verification of a membrane fault or failure analysis to find some other defect may require visual inspection of the membrane; this typically requires dis-assembly of the microphone which takes substantial time and effort. Also a small defect in the membrane may produce only a small parametric change at least initially, possibly even falling within normal measurement variability, but which may however get worse rapidly with use. These problems are particularly significant when samples from every manufacturing batch require reliability testing rather than just at initial release to production or a few samples once every few months.

MEMS transducers are manufactured in the form of semiconductor (typically silicon) wafers consisting of thousands of MEMS transducers, which are then separated into individual transducer die and individually assembled into separate packages to provide mechanical and environmental protection and convenient electrical connection to a host device. To avoid the wasted expense of packaging defective transducer die into packages it is desirable to test the transducer die at a wafer level and reject defective die before assembly. However in manufacturing testing it is not practical for mechanical and acoustic reasons to perform full acoustic stimulus and response testing on unpackaged transducer die.

It is therefore desirable to provide a testing mechanism for testing MEMS transducers for membrane integrity that is fast and simple to perform.

SUMMARY

An example of the invention provides a MEMS transducer comprising: a flexible membrane, the flexible membrane comprising a conductive track; and a continuity testing circuit electrically connected to the conductive track, wherein the conductive track is electrically isolated from any further conductive regions of the flexible membrane, and wherein the continuity testing circuit is configured to test the continuity of the conductive track. The combination of the conductive track and continuity testing circuit allow the MEMS transducer, in particular the flexible membrane, to be tested for damage in a simple and efficient manner.

A further example provides a MEMS transducer wherein the conductive track is divided into a plurality of conductive track portions, each conductive track portion being electrically connected to the continuity testing circuit. The plurality of conductive track portions allow separate areas of the flexible membrane to be monitored for damage, which can help to identify systematic weaknesses in MEMS transducer configurations.

A further example provides a MEMS transducer further comprising a substrate, wherein: the flexible membrane is attached to the substrate; and the conductive track is located within a perimeter region of the flexible membrane, an attachment between the flexible membrane and the substrate being located in the perimeter region of the flexible membrane. In some examples, the perimeter region of the flexible membrane may be the area of the membrane most likely to sustain damage, therefore locating the conductive track in this perimeter region increases the chances of damage to the flexible membrane being detected.

A further example provides a MEMS transducer comprising a flexible membrane, the flexible membrane comprising a conductive track, wherein the conductive track is electrically isolated from any further conductive regions of the flexible membrane, and wherein the conductive track is electrically connected to a plurality of bond pads, the bond pads being for connection to a continuity testing circuit. By connecting external test equipment to the bond pads, it is possible to test the continuity of the conductive track.

A further example provides a MEMS capacitive transducer comprising: a back-plate, comprising a back-plate electrode; a flexible membrane, the flexible membrane comprising a conductive track and a membrane electrode; and a continuity testing circuit electrically connected to the conductive track, wherein the continuity testing circuit is configured to test the continuity of the conductive track. This example facilitates the minimisation of the number of connections between the transducer and electric circuitry.

DESCRIPTION OF FIGURES

Examples of the present invention are described, by way of example only, with reference to the Figures, in which:

FIG. 1B is a perspective view of an example of a known MEMS device.

FIGS. 3A, 3B and 3C are schematic diagrams of examples each comprising plural conductive track portions.

FIGS. 4A and 4B are schematic diagrams of conductive track configurations in attachment regions between a flexible membrane and a substrate.

FIGS. 6A, 6B, 6C, 6D and 6E are circuit diagrams showing examples of continuity testing circuit configurations.

FIG. 7 is a schematic diagram of an example of a MEMS transducer die.

FIG. 9 is a schematic diagram of a membrane electrode and conductive track formed from a lattice of interconnected tracks.

DETAILED DESCRIPTION

Figure 2:
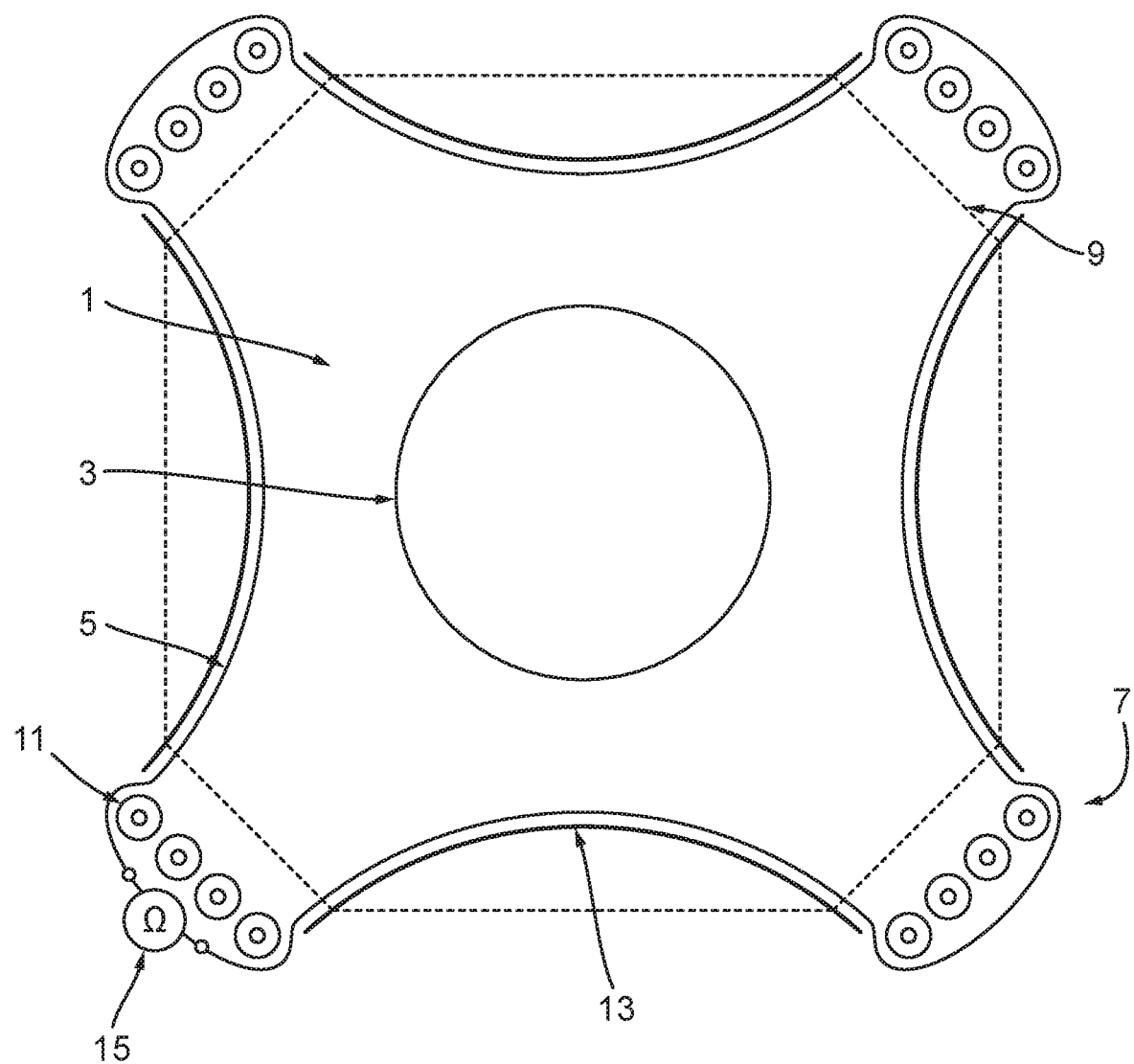
FIG. 2 is a schematic diagram of a flexible membrane in accordance with an example.

FIG. 2 shows an example of a flexible membrane 1. The flexible membrane 1 shown in FIG. 2 comprises a membrane electrode 3. The membrane electrode 3 may be configured to operate as part of a capacitive sensing system in conjunction with a further electrode separate from the flexible membrane (not shown). The form of the membrane electrode 3 may vary; the example shown in FIG. 2 includes a membrane electrode 3 which has a substantially circular shape.

The flexible membrane 1 also comprises a conductive track 5. Although the conductive track 5 is located on the flexible membrane, the conductive track may also extend into areas not located on the flexible membrane 1. In the example shown in FIG. 2, the conductive track 5 extends off the flexible membrane 1 in areas where the flexible membrane 1 is attached to a further structure, specifically a substrate 7.

The mechanical attachments between the flexible membrane 1 and the substrate 7 are formed using a portion of the membrane layer which is held in a fixed position relative to the substrate 7, and is therefore not free to move in response to incident stimuli (such as pressure waves). The regions in which the membrane layer is attached to the substrate 7 are referred to as supporting edges 9.

A supporting edge 9 can be considered to comprise a line segment along which the membrane layer is pinned, mounted, or anchored in fixed relation relative to the substrate 7. Preferably the supporting edges 9 are held in a fixed relation relative to the substrate 7 by means of one or more mount structures 11, such as a plurality of pillars, which effectively fix or pin the membrane directly or indirectly to the substrate 7. The mount structures 11 are thus preferably configured to define a supporting edge 9. In the example shown in FIG. 2, four supporting edges 9 are used to attach the membrane layer (comprising the flexible membrane 1) to the substrate 7.

The location of the supporting edge 9 effectively defines a boundary within the membrane layer. This boundary will become a boundary of a main membrane region of the transducer. The main membrane region may be considered to be the "active" membrane region of the transducer i.e. the region of the transducer membrane layer that is used for sensing and/or is dynamic; the flexible membrane 1. For example, in the case of a microphone device comprising a MEMS transducer as shown in FIG. 2, the active membrane region is the region of the membrane layer that is able to respond i.e. deflect—in response to an acoustic stimulus.

Thus, the shape of the membrane region may be at least partially defined by the boundary formed by the supporting, or fixed, edge(s).

It is possible that a single supporting edge 9 may extend around the entire flexible membrane 1, such that the entire region of the membrane layer that is used for sensing and/or that is dynamic is bounded by the supporting edge 9. Alternatively, the membrane region may also be bounded by one or more other edges which are unsupported and can therefore be considered to be "free" or "unfixed" edges of the membrane. The unfixed edges 13 are potentially able to move relative to the substrate 7 as the flexible membrane 1 deflects in response to an acoustic pressure differential across the membrane. The unfixed edges 13 may e.g. be defined by the edge of the deposited membrane layer, or by slits etched through the deposited membrane layer leaving a further region of the deposited membrane layer on the other side of the slit. In the example shown in FIG. 2, the four supporting edges 9 that are used to attach the membrane layer (comprising the flexible membrane 1) to the substrate 7 alternate around the perimeter of the flexible membrane 1 with four unfixed edges 13.

As shown in FIG. 2, the conductive track 5 is electrically separate from the membrane electrode 3. That is, the conductive track 5 is electrically isolated from the membrane electrode 3, such that regions of electrically insulating material are located between the conductive track 5 and the membrane electrode 3. Typically, the insulating material located between the conductive track 5 and the membrane electrode 3 is the material forming the flexible membrane 1. The membrane electrode 3 as shown in FIG. 2 is an example of a conductive region of the flexible membrane 3. The flexible membrane 3 may also comprise further conductive regions, for example, further membrane electrodes. The conductive track 5 is electrically isolated from any further conductive regions of the flexible membrane 3, rather than just being electrically isolated from the flexible membrane 3. Also, the MEMS transducer may further comprise a back plate portion including a back plate electrode (which may be configured to form a capacitive system with the membrane electrode). Where a back plate electrode is present, the conductive track 5 is electrically isolated from the back plate electrode.

The material from which the membrane layer is formed is at least partially determined by the intended function of the MEMS transducer. Silicon nitride (SiN) provides an excellent combination of flexibility and resilience, and therefore is utilised in a broad range of MEMS transducer applications. A further material which may be used in a broad range of membrane applications is polyimide. Both Silicon nitride and polyimide are insulators, and therefore can act to electrically isolate the conductive track 5 from the membrane electrode 3.

By contrast, the conductive track 5 and membrane electrode 3 are, by necessity, formed from a conductive material. Typically the same conductive material is used to form both the conductive track 5 and the membrane electrode 3, to reduce the number of formation steps required to construct the MEMS transducer, although different materials may be used to form the conductive track 5 and the membrane electrode 3 depending on the specific requirements of a given MEMS transducer. An example of a suitable material for use in the formation of both the conductive track 5 and the membrane electrode 3 is aluminium (Al), which possesses a high conductivity and is a well-established material in silicon manufacturing processes. Other materials which may be used include titanium and copper. Typically, the material used to form the conductive track 5 is a metal (such as the examples discussed above). The metal used to form the conductive track 5 may be used in elemental form, or as part of an alloy, e.g. aluminium silicon, depending on the precise properties required for a given MEMS transducer. A conductive track may comprise a metallic compound, for instance titanium silicide or salicide may be used. Other compounds, such as doped polysilicon, may also be used to form one or both of the conductive track 5 and the membrane electrode 3 overlying the main layer of the flexible membrane. In some embodiments the conductive track may be deposited on top of a different, flexible, material, for example an aluminium track on top of a flexible silicon nitride membrane. In some embodiments the conductive track may comprise a region of the flexible membrane which is structurally merged but chemically different from insulating parts of the membrane, for example conductive regions of doped polysilicon in a flexible membrane comprising undoped or oppositely doped polysilicon to provide electrical isolation.

The primary function of the conductive track 5 is to allow the detection of damage to the membrane layer, in particular damage to the flexible membrane 1. The detection of damage to the membrane layer is facilitated by detecting breaks or other damage in the conductive track 5. When damage to the membrane layer occurs in the region of the conductive track 5, this generally results in the conductive track 5 being damaged or broken. That is, the damage to the membrane layer can result in a discontinuity in the conductive track 5 which impedes (or potentially prevents) the flow of electricity along the conductive track 5. In order to detect a discontinuity in the conductive track 5, it is therefore necessary both to direct an electric current along the conductive track 5, and to monitor properties of the electric current directed along the conductive track 5.

In order to allow electric current to be directed along the conductive track 5, and to monitor the properties of the electric current, the conductive track is connected to a continuity testing circuit 15. Various different types of continuity testing circuit 15 may be used in different examples. In the schematic of an example shown in FIG. 2, the continuity testing circuit 15 is represented by a simple icon; the details of some of the different types of continuity testing circuit 15 that can be used in examples (including the example shown in FIG. 2) are discussed in greater detail below.

In operation, an electrical current is passed through the conductive track 5 by the continuity testing circuit 15, which also monitors the properties of the electric current directed onto the conductive track 5. The expected properties of the electric current are influenced to some extent by the specific design of an example of the conductive track 5. For example, for each different configuration of the conductive track 5 on and about the flexible membrane 1 there will be a different expected total resistance, because the resistance of the conductive track 5 is dependent on the resistivity of the material used to form the conductive track 5, the thickness of the conductive track 5, and so on. Accordingly, for each different configuration example, expected electrical properties when the conductive track 5 is undamaged are established. These properties may be established by theoretical modelling of the track behaviour, however it is often simpler to establish the properties by experimentation. The experimentation may involve producing one or more examples of the flexible membrane 1 comprising a given conductive track 5 layout, verifying that the flexible membrane 1 and conductive track 5 are undamaged, and then measuring the electrical properties of the layout.

Once the expected properties of a conductive track 5 configuration example have been established, these properties can be used to set acceptance thresholds. The acceptance thresholds can be used to provide upper limits to properties, lower limits to properties, or both (that is, to provide acceptable ranges for properties). Therefore, the acceptance thresholds can be used to establish acceptance ranges for the measured electrical properties. Acceptance ranges are established below upper limits to properties, above lower limits to properties, and between upper and lower limits, depending on which combination of limits are relevant to a given property. Preferably the acceptance range corresponds to say a number of statistically observed standard deviations, for example 3 or 6 standard deviations of the observed property variation, so that relatively minor degradation of track 5 may be detected, rather than only damage severe enough to cause a complete open circuit. Thus the continuity test circuit may test for continuity in terms of degradation of the continuity rather than only complete loss of continuity.

The selection of which electrical properties to monitor is largely dependent on the configuration of the surrounding system, for example the type of continuity testing circuit 15 used. This is discussed in greater detail below.

It is then possible to test each MEMS transducer produced that uses a given configuration example for track continuity. Depending on the quality control requirements of a given situation (which may be determined by the nature of the product into which the MEMS transducers are to ultimately be included), it is possible that every MEMS transducer produced may be tested. Alternatively, a percentage of each batch of MEMS transducers produced or a given percentage of the transducers generated using a continuous production process may be tested.

If the properties monitored by the continuity testing circuit 15 used to monitor a given conductive track 5 are within the acceptance ranges, then the conductive track 5 is determined to be intact and the membrane is likely undamaged. By contrast, if the properties monitored by the continuity testing circuit 15 used to monitor a given conductive track 5 are outside the acceptance ranges, then the track is considered to be damaged (potentially broken) and the membrane is likely damaged.

When likely membrane damage is detected, the MEMS transducer can be extracted from the supply chain before integration into an electronic device, thereby reducing the downstream failure rate for MEMS transducers or assemblies comprising MEMS transducers and making it easier for quality control requirements of manufacturers (which may require that the number of failed MEMS transducers is below a given threshold) to be met. In examples wherein the continuity testing circuit 15 is integrated into the MEMS transducer, such as where the continuity testing circuit 15 is on the same die as the MEMS transducer, the continuity testing can be done at any point once the MEMS transducer has been manufactured. Accordingly, the continuity testing can be performed prior to packaging the MEMS transducers, in addition or alternatively to after packaging the MEMS transducers but before shipping the MEMS transducers. Continuity testing the MEMS transducers at the point of incorporating the MEMS transducers into electronic devices allows damage to the flexible membrane 1 which may occur after formation of the MEMS transducers (for example, in transit to a manufacturer of electronic devices) to be detected. The continuity testing can be performed without any requirement for full acoustic stimulus and response testing, as discussed above.

The MEMS transducers can also be tested once integrated into electronic devices, both shortly after integration and before shipping to customers by the manufacturer of electronic devices, and also during the operating lifetime of the electronic devices by customers or repair engineers. In this way, the continuity testing circuit 15 can be used in a fault diagnosis process in the event that an electronic device ceases to function correctly. Depending on the level of monitoring desired, the MEMS transducer may be configured such that the continuity testing circuit 15 tests the continuity of the membrane periodically (for example, daily) throughout the lifetime of the device. The MEMS transducer may also be configured to perform a continuity test each time the electronic device into which the MEMS transducer is incorporated is activated (for example if the electronic device is a mobile phone, each time the mobile phone is turned on). For the highest level of monitoring, the MEMS transducer may be configured such that the continuity testing circuit 15 is continually active, and the continuity test is ongoing throughout the time the electronic device comprising the MEMS transducer is active. This continual testing mode may be of most use where the electronic device into which the MEMS transducer is incorporated is performing a critical role, where any failure must be immediately rectified.

A further use of the continuity testing circuit 15 is in the development phase of a MEMS transducer configuration, for example, in the development of a new flexible membrane 1 design or in the testing of a new fabrication process. In this phase, the continuity testing circuit 15 can be used to identify if a new process or design results in a higher than acceptable rate of membrane failure. Once a flaw in the process or design has been identified, the design or process can be altered to address this issue. As the continuity testing circuit 15 makes the testing of a high percentage or a large number of constructed MEMS transducers (potentially all of the constructed MEMS transducers from many production batches) a practical option, it is possible to identify even relatively infrequent flaws prior to making a MEMS transducer available to device manufacturers, or prior to investing in a full production run of the MEMS transducer.

Further examples of flexible membranes are shown in FIGS. 3A and 3B. In the example shown in FIG. 2, the conductive track 5 is connected to the continuity testing circuit 15 at two discrete positions. As shown in FIGS. 3A and 3B, the conductive track 5 may be divided into plural portions 5a and 5b, wherein each portion is connected to the continuity testing circuit 15. In the example shown in FIG. 3A, the portions 5a and 5b are connected separately to the same continuity testing circuit 15, to minimise the number of components required to construct the MEMS transducer. In other examples such as the example shown in FIG. 3B, the portions 5a and 5b may be connected to different continuity testing circuits 15 among a plurality of continuity testing circuits 15. Where plural continuity testing circuits 15 are used, the location of a break in the conductive track 5 can be pinpointed more accurately. Accordingly, this configuration can be useful during the design and prototyping of a given MEMS transducer configuration.

Figure 3C:
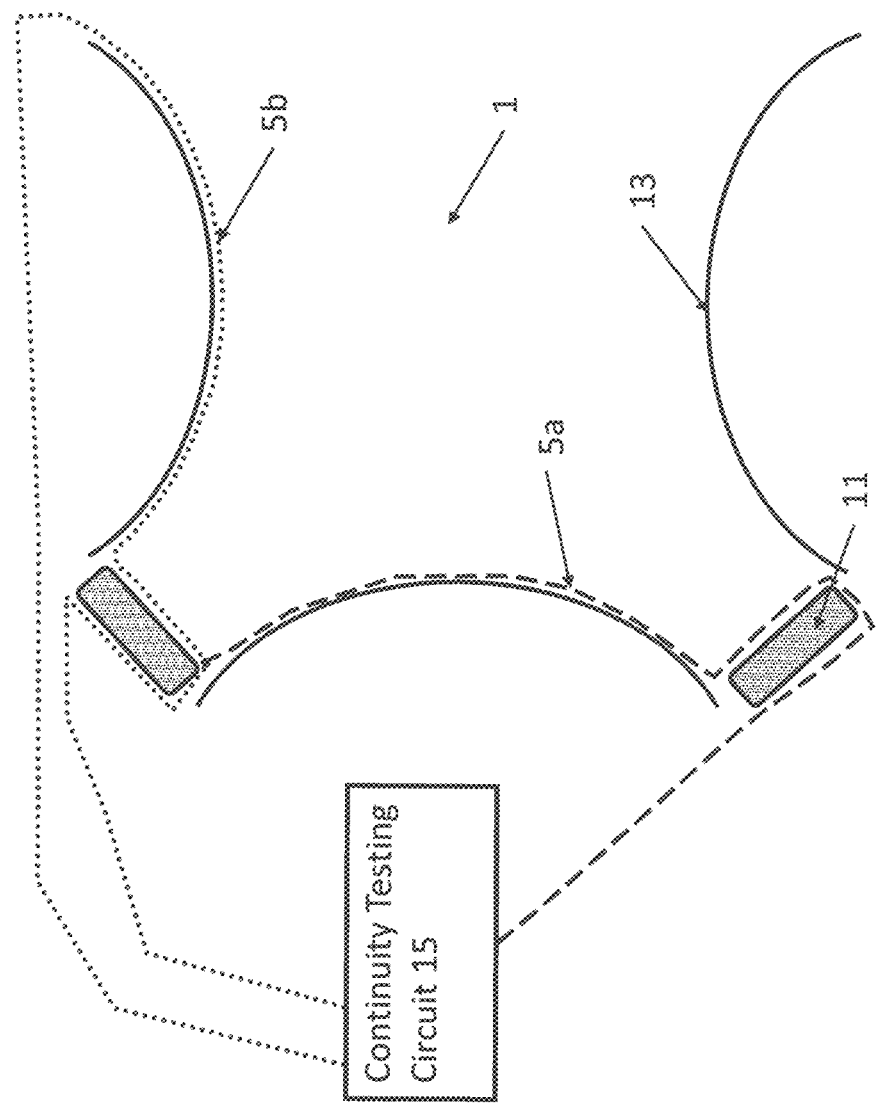

In both of the examples discussed above (and shown in FIGS. 3A and 3B), the portions of the conductive track 5 are and electrically isolated from the other portion(s) of the conductive track 5. In a further example, the portions of the conductive track 5 are not electrically isolated from one another, but are electrically isolated from any further conductive regions of the flexible membrane. An example of this configuration is shown in FIG. 3C, wherein the portions 5a and 5b are connected to one another on the flexible membrane 1 (the portions 5a and 5b may also be connected in an area off the flexible membrane 1, such as at a common terminal connected to the continuity testing circuit 15). Where the portions 5a and 5b of the conductive track 5 are not isolated from one another, this can reduce the number of connections required to the continuity test circuitry, albeit requiring slightly more complex continuity test circuitry, for example as discussed in greater detail below with respect to FIGS. 6C and 6D.

In the example shown in FIG. 2, the flexible membrane 1 is attached to a substrate 7. The attachment is effected by mount structures 11; in the example shown in FIG. 2 the mount structures 11 comprise a plurality of pillars 17 on which the membrane is supported above the underlying silicon substrate. The mount structures 11 are configured to retain the membrane in position and therefore restrict the movement of the flexible membrane 1 with respect to the substrate 7. Because of the role of the mount structures 11 in restricting the movement of the membrane layer, the portions of the membrane layer which abut the mount structures may be more susceptible to damage. The use of pillars 17 in some examples of the attachment can exacerbate the risk of local damage to the membrane, as stress concentrations at the pillars 17 can be the starting point for tears in the membrane layer. Therefore, as shown in FIGS. 4A and 4B, the conductive track 5 may be concentrated in the area of the attachment between the membrane layer and the substrate 7. In the example shown in FIG. 4A, the attachment does not use mount structures or pillars 17, and the conductive track is generally concentrated in the area near supporting edge 9 where the membrane layer is attached to the substrate 7.

As shown in FIG. 4B, the conductive track 5 may be configured to substantially encircle at least one of the pillars 17, preferably all of the pillars 17. The example of a path shape shown in FIG. 4B is for illustrative purposes; various other path shapes may be used as required to encircle the pillars 17 (or other mount structures 11). The conductive track 5 may substantially encircle the mount structures 11 individually (as shown in FIG. 4B), or collectively (similar to the way in which the mount structure 11 is substantially encircled in FIG. 3A).

As discussed above, the flexible membrane 1 may be bounded by supporting edges 9 and unfixed edges 13. The area of the membrane layer containing the supporting edges 9 and unfixed edges 13 can therefore be generally referred to as the perimeter region of the flexible membrane 1. The perimeter region of the flexible membrane 1 may be one of the areas of the membrane layer most susceptible to damage. In areas where the boundary of the flexible membrane 1 comprises supporting edges 9, this edge can be subjected to stresses due to the movement of the flexible membrane 1 portion of the membrane layer, while the portion of the membrane layer that is pinned, mounted, or anchored in fixed relation relative to the substrate 7 clearly cannot move in tandem with the flexible membrane 1. Also, in areas where the boundary of the flexible membrane 1 comprises unfixed edges 13, the unrestrained nature of the unfixed edge 13 can result in deflections beyond the design tolerance of the membrane, and therefore potential tears. The perimeter region may also be susceptible to damage during the construction of the MEMS transducer due to interactions with this region during the construction of the MEMS transducer.

Accordingly, in some examples (such as that shown in FIG. 2), the conductive track 5 is located in the perimeter region of the flexible membrane 1, so as to allow damage in this region to be more easily detected. In particular, where the perimeter region comprises alternating supporting edges 9 and unfixed edges 13, any force resulting from the movement of the flexible membrane 1 may be concentrated in the supporting edges 9, so the conductive track may be concentrated in the regions containing the supporting edges 9.

Figure 5:
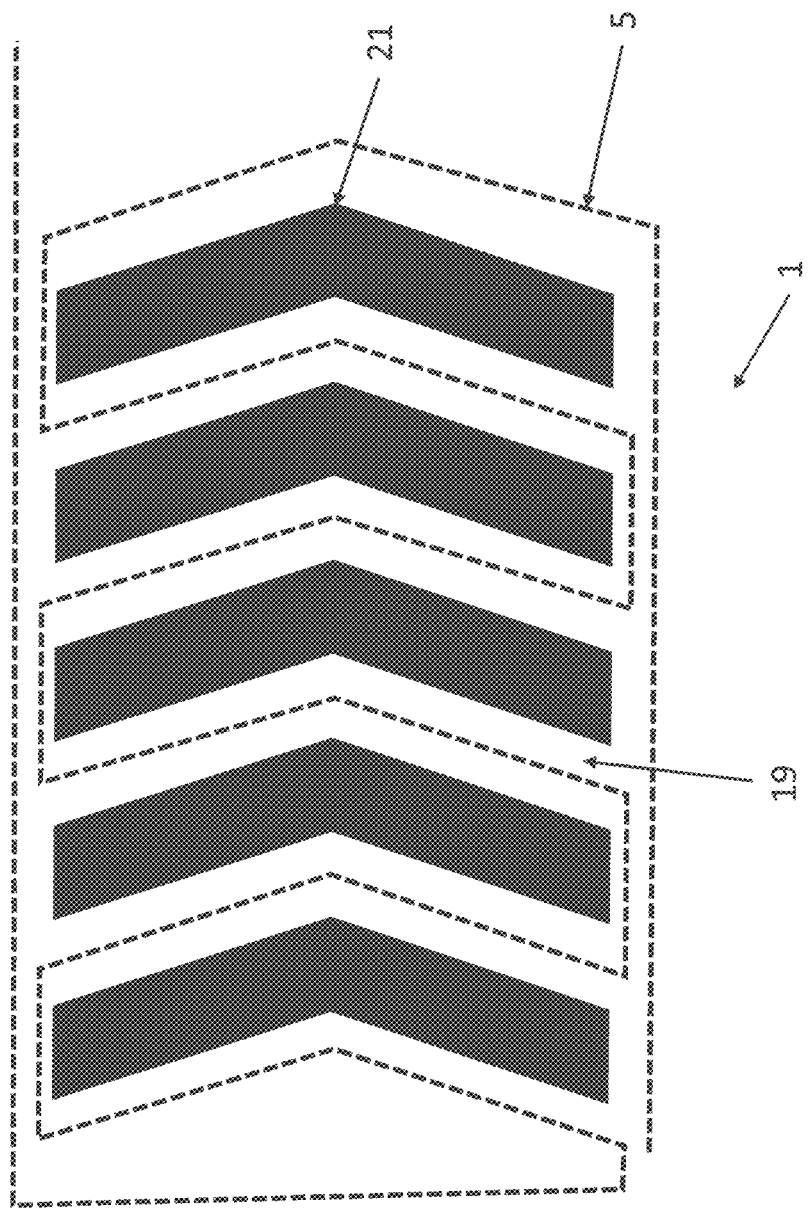
FIG. 5 is a schematic diagram of an example of a conductive track configuration in the vicinity of spring portions in the perimeter region of a flexible membrane.

In some examples, the perimeter region of the flexible membrane may comprise a plurality of spring portions separated by gaps which can be used to help provide additional flexibility to the flexible membrane if the remainder of the flexible membrane is comparatively rigid (for example, due to a high concentration of electrode material). An example wherein a perimeter region comprises spring portions 19 separated by gaps 21 is shown schematically in FIG. 5. Where spring portions 19 are included in the perimeter region, the high flexibility of the spring portions 19 (relative to the remainder of the flexible membrane 1) is used to allow the flexible membrane 1 to detect incident stimuli (e.g. pressure waves). Accordingly, the spring portions 19 are required to deform repeatedly, and may therefore be susceptible to damage. In order to allow damage to the spring portions 19 to be detected, the conductive track 5 may be configured to follow a path along and/or around the spring portions 19. In particular, the conductive track 5 may follow a serpentine path along and around the spring portions 19, as shown in FIG. 5.

Figure 6B:
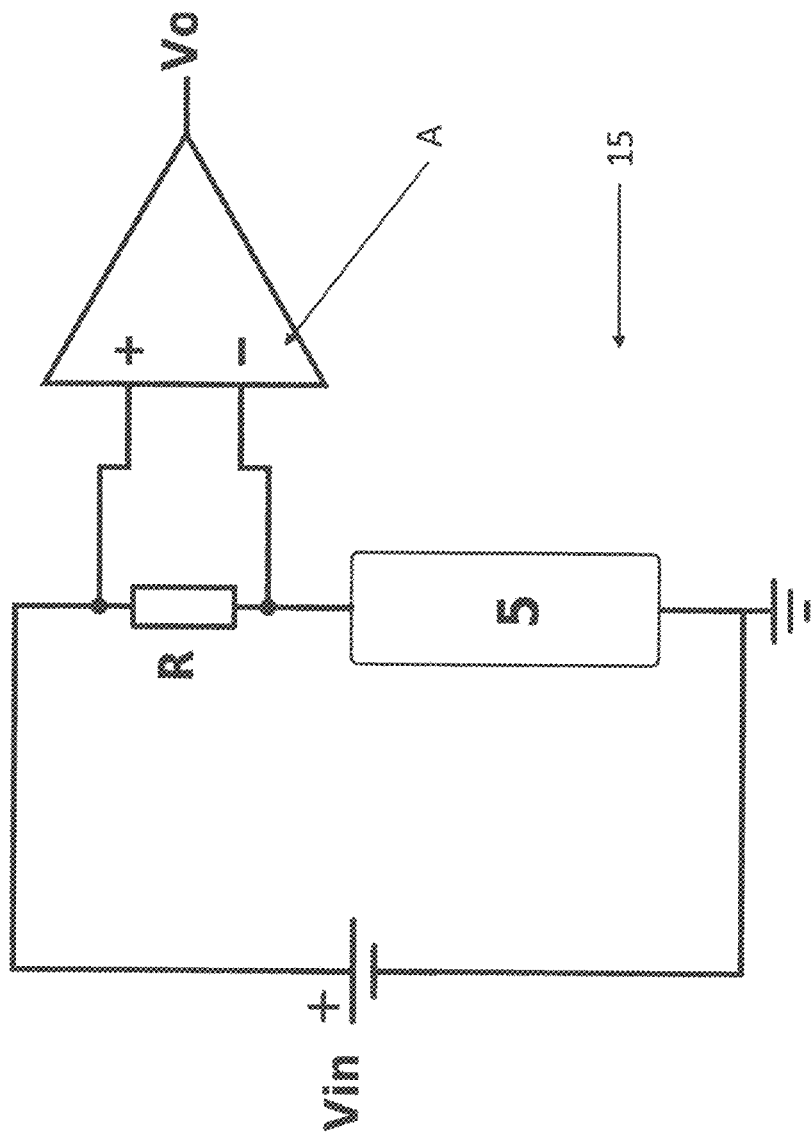
Figure 6C:
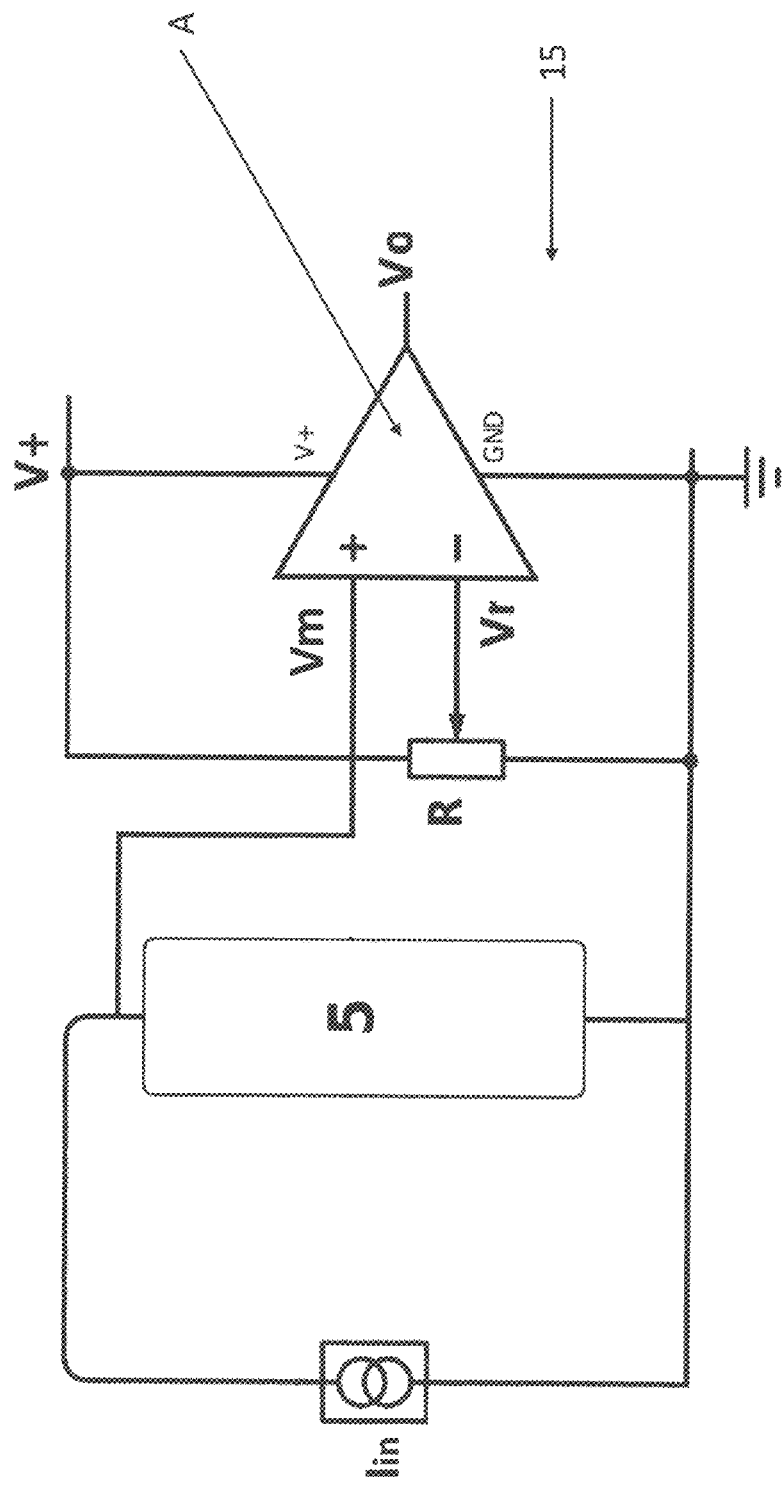
Figure 6D:
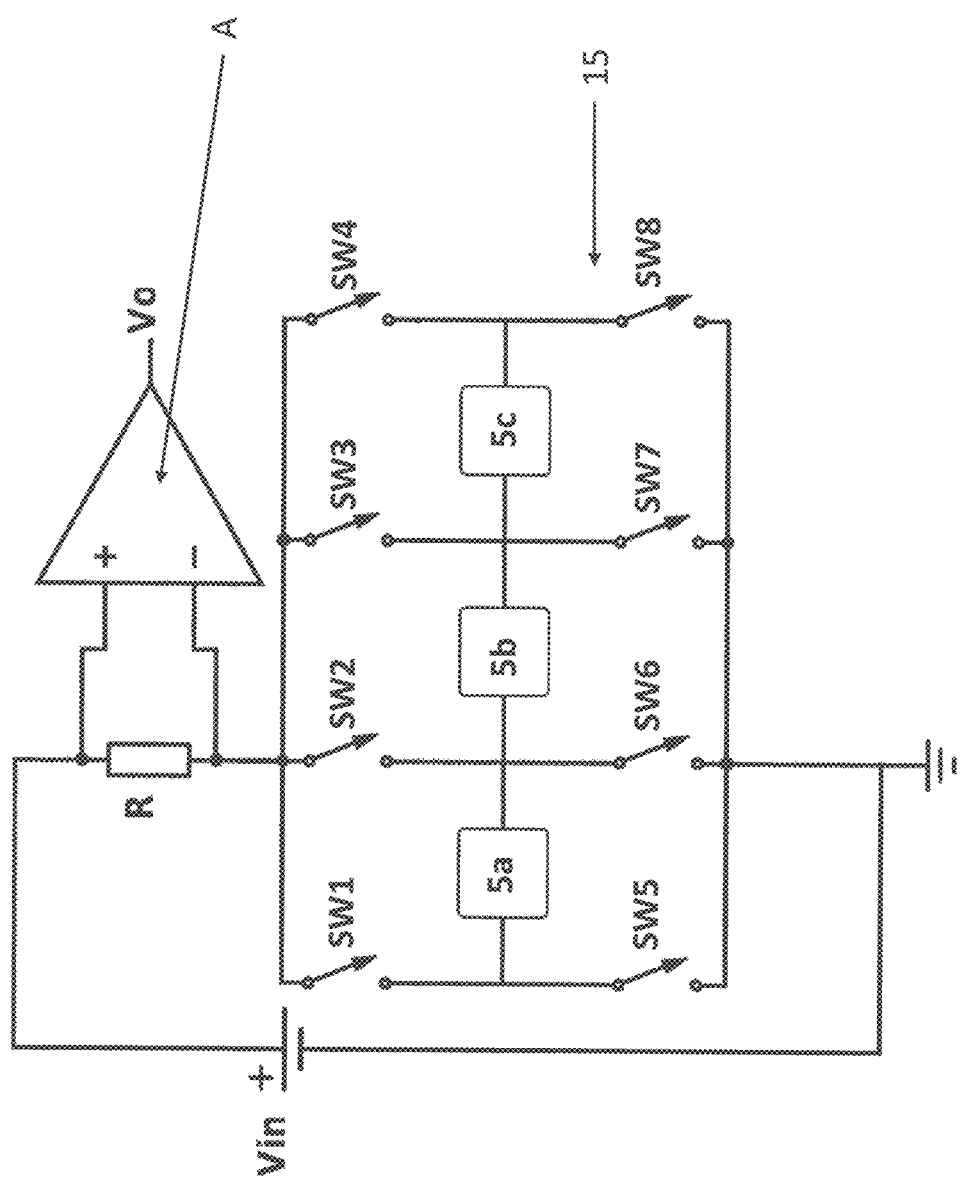
Figure 6E:
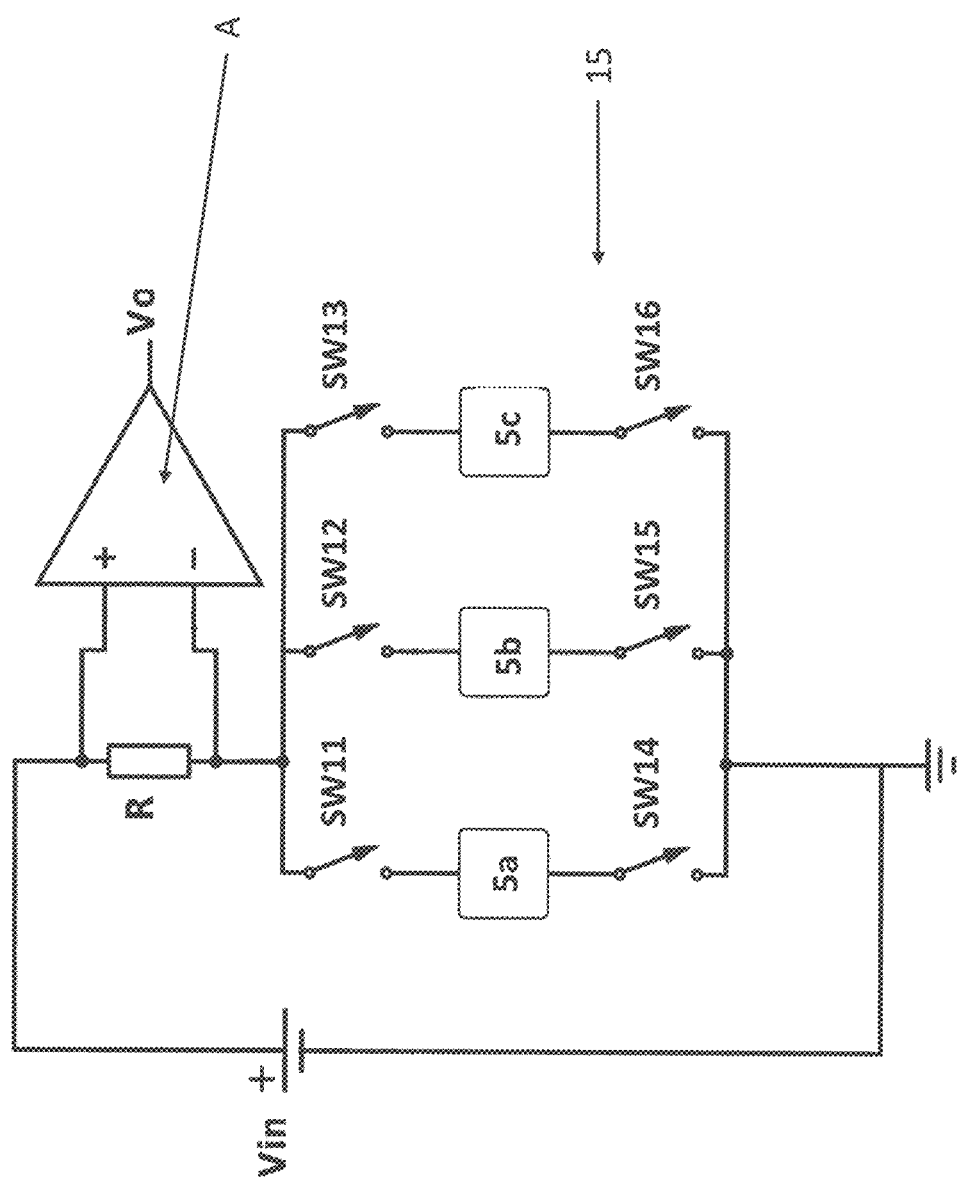

As discussed above, several different types of continuity testing circuit 15 may be used. Examples of different types of continuity testing circuits 15 that may be used are shown in FIGS. 6A, 6B, 6C, 6D and 6E. FIG. 6A shows a low-side current sensing circuit, FIG. 6B shows a high-side current sensing circuit, and FIG. 6C shows a voltage sensing circuit. FIGS. 6D and 6E show continuity testing circuits 15 used in examples wherein the conductive track 5 comprises a plurality of conductive track portions 5a and 5b. The circuits shown in FIGS. 6A, 6B, 6C, 6D and 6E are examples of continuity testing circuits 15 that may be used; other types of continuity testing circuits 15 may also be used as required.

In the low-side current sensing circuit shown in FIG. 6A, a sense resistor R of known resistance is positioned between the conductive track 5 and a ground connection. The terms "low-side" and "high-side" refer to the position of a monitoring point relative to the conductive track 5, with respect to the positive or negative terminals of the power supply (Vin). Input terminals of a differential amplifier A are connected to terminals of the sense resistor Rs; the amplifier A is thus used to measure the voltage across the sense resistor Rs. Knowledge of the sensed voltage and of the value of the sense resistor allows the current flowing in the sense resistor to be calculated. The sense resistor Rs is in series with the conductive track 5, therefore this current is equal to that flowing through the conductive track 5. A larger than expected resistance from the conductive track 5 (for example, due to damage to the conductive track 5) will result in a lower than expected current flow through the conductive track and hence a lower voltage measured by the op amp A, and a corresponding lower recorded current flow. If the current flow falls below a pre-set threshold for a given configuration (as discussed above, this is equivalent to the recorded current being outside an acceptance range), this is taken to indicate that the conductive track is damaged.

The high-side current sensing circuit shown in FIG. 6B is similar to the low-side current sensing circuit of FIG. 6A, save that the relative positions of the monitoring point and the conductive track 5 are reversed. Again, a drop in the recorded current flow may indicate damage to the conductive track 5 and, if the recorded current flow falls below a pre-set threshold for a given configuration (as discussed above), this is taken to indicate that the conductive track is damaged.

The voltage sensor circuit shown in FIG. 6C operates on a similar principle to the current sensing circuits in FIGS. 6A and 6B; a measured (DC) voltage that is outside an acceptance range is an indicator of a damaged track (and likely a damaged membrane). In this example, a reference current from current source Iin is imposed to flow through the conductive track 5, and a reference voltage Vr is set using resistive divider R. The voltage measured at one terminal of the conductive track 5 (Vm) is compared to the reference voltage using a differential amplifier or comparator. If the measured voltage is below the acceptance threshold (set by Vr), then the comparator output Vo will go low and the conductive track is thus indicated to be intact. By contrast, if Vm is higher than Vr the comparator output Vo will go high and this is taken to indicate that the conductive track is damaged.

The examples of circuits shown in FIGS. 6D and 6E are for use in configurations wherein the conductive track 5 is divided into a plurality of conductive track portions 5a, 5b and 5c. Both of FIGS. 6D and 6E are based on the high-side current sensing circuit shown in FIG. 6B, adapted for use with plural conductive track portions 5a, 5b and 5c. Of course, the plural portions 5a, 5b and 5c are not limited to use with the circuits shown in FIGS. 6D and 6E, and any suitable circuit may be used.

In the example shown in FIG. 6D, the plural portions 5a, 5b and 5c are connected to the circuit using an array of switches SW1 to SW8. This arrangement allows individual portions or different combinations of the plural portions 5a, 5b and 5c to be tested together by opening and closing various switches. For example, the circuit could be configured by closing only switches SW1 and SW6 so that only portion 5a is tested. Alternatively, the circuit could be configured by closing switches SW1 and SW7 so that portions 5a and 5b are connected in series, such that only if both of these portions are intact (that is, not damaged) will the continuity check be passed. The example shown in FIG. 6D therefore provides flexibility in the testing, at a cost of increasing the complexity of the circuit.

In the example shown in FIG. 6E, all of the plural portions 5a, 5b and 5c are connected in parallel to the circuit, using switches SW11 to SW16. The example shown in FIG. 6E is simpler than that shown in FIG. 6D, however imposes restrictions on how testing may be performed. For example, if in a given example switches SW11, SW12, SW14 and SW15 were closed to monitor portions 5a and 5b, then if say portion 5a became open circuit, portion 5b would still carry say half the original current in this example, so the current flowing in sense resistor Rs would only halve rather than decreasing to zero. So in this example preferably only one of the plural portions 5a, 5b and 5c should be tested at a time.

In the example shown in FIG. 6E, switches SW14, SW15 and SW16 (or alternatively SW11, SW12 and SW13) could be replaced by electrical shorts while still providing individual test access to the track portions 5a, 5b and 5c. These shorts could be simple common nodes on the conductive track, on or off the flexible membrane; this is an example of a conductive track configuration having a more complex topology than that of a string of consecutive portions in series.

Other circuit configurations can be used in examples comprising plural portions 5a, 5b and 5c, for example, all of the portions 5a, 5b and 5c may be simply connected in series. The exact nature of the connections between the plural portions 5a, 5b and 5c and the circuit is determined based on the requirements of the system.

As mentioned above, the continuity testing circuit 15 is preferably integrated on the same semiconductor substrate as the MEMS transducer. In some examples, the semiconductor substrate may also comprise circuitry used to control the operation of the transducer, for example, bias or amplifier circuitry required for the MEMS transducer to function as a microphone. The co-integrated circuitry may also comprise circuitry to control the continuity testing circuit 15, for example to control the periodicity of the conductive track 5 continuity testing (for example, on activation, at a given time interval, continuously, and so on).

In an alternative example a packaged MEMS transducer may comprise one die comprising the MEMS transducer element and a separate integrated circuit or ASIC comprising some or all of the associated circuitry. The continuity testing circuit may be implemented on the ASIC (potentially in conjunction with other circuitry). Where the continuity testing circuit is implemented separately from the MEMS transducer element (for example, on the ASIC), the MEMS transducer die comprises bond pads for connection via bond wires or solder balls to the continuity testing circuit. An example of a MEMS transducer die of this configuration is shown in FIG. 7.

As illustrated in FIG. 7, each conductive track portion 5a, 5b, 5c on the transducer die that is to be used for continuity testing has a bond pad 23 at each end. Thus the transducer die will comprise one or more conductive track portions 5a, 5b, 5c on the flexible membrane 1 (and possibly extending past the flexible membrane 1), with each track portion connected to a bond pad 23 at each end for connection to continuity test circuitry on the ASIC die. The bond pad 23 may be shared between track portions 5a, 5b, 5c, or each track portion 5a, 5b, 5c may use separate bond pads 23. In the example shown in FIG. 7, a single conductive track 5 is shown (not divided into discrete portions) for simplicity. The connection 25 from the membrane electrode 3 to a bond pad 23 is also shown in FIG. 7, to illustrate how the various connections to bond pads 23 may be arranged.

Relative to examples wherein the continuity testing circuit forms part of the MEMS transducer (such as where the continuity testing circuit is located on the same die as the flexible membrane 1), configurations wherein the continuity testing circuit 15 is implemented separately from the MEMS transducer die have the disadvantage that the continuity of the tracks on the transducer die cannot be autonomously tested by circuitry on the transducer die before the cost of assembling together with the ASIC is incurred. However examples such as that shown in FIG. 7 still allow reliability or ongoing functional testing of the membrane. The transducer die as illustrated in FIG. 7 may still be tested for continuity of the conductive tracks 5 by external test equipment, with microprobes or similar used to establish connections to the bond pads connected to the conductive tracks 5, so pre-assembly testing is still possible.

Figure 1A:
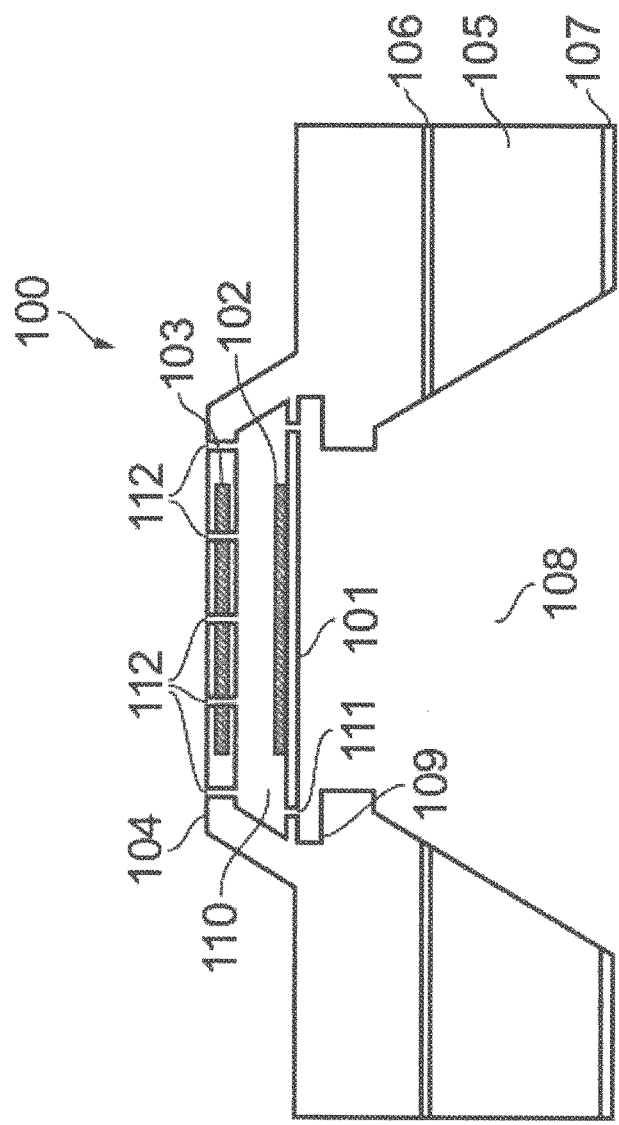
FIG. 1A is a schematic diagram of an example of a known MEMS device.
Figure 8:
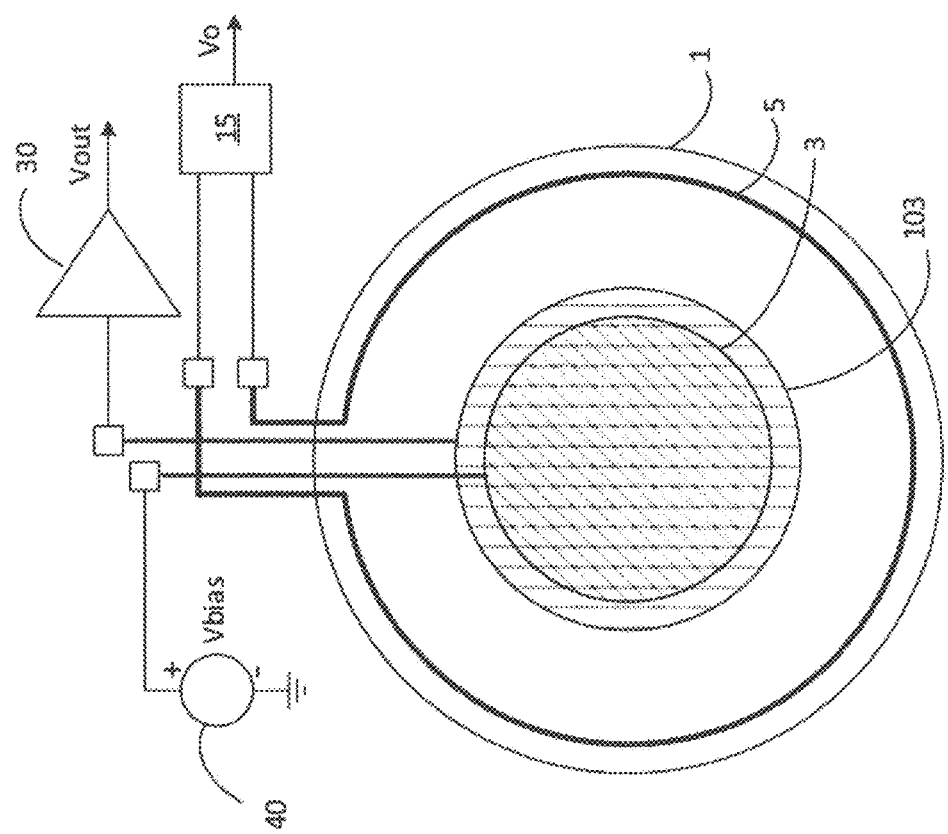
FIG. 8 is a schematic diagram of an example of a MEMS capacitive transducer.

FIG. 8 illustrates schematically an example of a MEMS capacitive transducer comprising a flexible membrane 1 comprising a conductive track 5 and membrane electrode 3. Continuity testing circuitry 15 is connected to conductive track 5 to provide an indication Vo of the integrity of the conductive track. A backplate electrode 103 is supported in a backplate above membrane electrode 3 (that is, in a spaced relation relative to the membrane electrode 3, for example, a similar structure to that illustrated in FIG. 1A) to co-operate with the membrane electrode 3 to provide an inter-electrode capacitance that may be modulated by incoming stimuli, such as incoming pressure waves. A voltage supply 40, for example a charge pump, supplies a bias voltage Vbias to the membrane electrode 3. An amplifier 30 is connected to back plate electrode 103 to provide a signal Vout based on the voltage or charge on the membrane electrode indicative of the inter-electrode capacitance and hence of the incoming stimuli. In variations on this example, the connections to membrane electrode and back plate electrode may be interchanged.

Preferably, as shown in FIG. 8 and as discussed in detail above, the conductive track is electrically isolated from both the membrane electrode 3 and the back plate electrode 103. However in some variations of this example one of the membrane electrode 3 and the back plate electrode 103 may be connected to a node of the conductive track. This reduces the number of connections from components of the transducer structure to electrical circuitry. However if the electrode connected to the amplifier 30 is connected to the conductive track, extra parasitic capacitance is added to the circuit node which will tend to degrade the sensed signal. If the electrode connected to the voltage supply 40 is connected to the conductive track than Vbias will be applied to the continuity test circuitry 15. Vbias may be a boosted, relatively high voltage, to maximise the signal derived from the inter-electrode capacitance and is may be in excess of the maximum voltage allowed on standard integrated transistors, so may require complex non-standard design techniques to manage.

In the diagram shown in FIG. 2, the membrane electrode 3 is shown with a simple planar shape, that is, a layer covering an area of the flexible membrane 1 substantially without gaps. This is a form that the membrane electrode 3 may take. However, in other examples, the membrane electrode 3 uses a different form. An example of a different form of the membrane electrode is shown in FIG. 9. In FIG. 9, the membrane electrode 3 uses a dispersed form (wherein the electrode does not form a simple planar shape); specifically the membrane electrode 3 is formed from a lattice of interconnected tracks.

Use of a dispersed form, such as a lattice structure, can produce membrane electrodes 3 which have a smaller effect on the rigidity of the flexible membrane 1, while still providing an acceptable degree of coverage over the surface of the flexible membrane 1. Other dispersed forms, such as separate but connected planar portions, may also be used in some circumstances. A decision on whether or not a dispersed form is appropriate for the membrane electrode 3 can be made depending on the intended use of the MEMS transducer comprising the flexible membrane 1.

Where the membrane electrode 3 uses a lattice structure, this structure may also be used for the conductive track 5 in order to simplify the formation process of the MEMS transducer (both of the membrane electrode 3 and the conductive track 5 can more easily be formed in the same construction step if the membrane electrode 3 and the conductive track 5 have the same structure). However, some examples use different structures for the membrane electrode 3 and conductive track 5. In the example shown in FIG. 9, both of the membrane electrode 3 and the conductive track 5 have a lattice structure. The membrane electrode 3 occupies a substantially square region in the centre of the flexible membrane 1 (only a portion of this region is shown in FIG. 9). It is still necessary for the conductive track 5 to be electrically isolated from the other conductive regions of the flexible membrane 1, so the lattice structure forming the conductive track 5 is not electrically connected to the membrane electrode 3. Instead, the conductive track 5 follows a path around the perimeter of the flexible membrane 1, as shown in FIG. 9. In the example shown in FIG. 9, a single conductive track 5 is formed, and no mounting structures 11 or spring portions 5 are present. However, as discussed above with reference to FIGS. 3A, 3B, 3C, 4 and 5 plural conductive tracks 5 (which may or may not be connected to different continuity testing circuits 15) that may or may not substantially encircle mounting portions 11 and which may or may not follow a serpentine path along and around spring portions 19 may also be used with the lattice structure.

As will be appreciated, the above detailed description is provided by way of example only, and the scope of the invention is defined by the claims.

It should be understood that the various relative terms upper, lower, above, below, top, bottom, underside, overlying, beneath, etc. that are used in the present description should not be in any way construed as limiting to any particular orientation of the MEMS transducer during any fabrication step and/or it orientation in any package, or indeed the orientation of the package in any apparatus. Thus the relative terms shall be construed accordingly.

Examples described herein may be usefully implemented in a range of different material systems, however the examples described herein are particularly advantageous for MEMS transducers having membrane layers comprising silicon nitride.

In the examples described above it is noted that references to a MEMS transducer may comprise various forms of transducer element. For example, a MEMS transducer may be typically mounted on a die and may comprise a single membrane and back-plate combination. In another example a MEMS transducer die comprises a plurality of individual transducers, for example multiple membrane/back-plate combinations. The individual transducers of a transducer element may be similar, or configured differently such that they respond to acoustic signals differently, e.g. the elements may have different sensitivities. A transducer element may also comprise different individual transducers positioned to receive acoustic signals from different acoustic channels.

According to one or more examples, the transducer may further comprise an integrated circuit die, the integrated circuit die comprising analogue circuitry or digital circuitry. The integrated circuit die may comprise a programmable digital signal processor.

An electronic device according to a further aspect may comprise a MEMS transducer according to any of the examples described herein. The device may be at least one of: a portable device; a battery power device; a computing device; a communications device; a gaming device; a mobile telephone; an earphone or in-ear hearing aid, a personal media player; a laptop, tablet or notebook computing device.

According to a further aspect there is provided a MEMS capacitive transducer comprising: a backplate, the backplate comprising a back-plate electrode; a flexible membrane, the flexible membrane comprising a conductive track and a membrane electrode; and a continuity testing circuit electrically connected to the conductive track, wherein the continuity testing circuit is configured to test the continuity of the conductive track.

Also provided are methods of fabricating a MEMS transducer according to any of the examples or aspects described herein.

It is noted that the examples described above may be used in a range of devices, including, but not limited to: analogue microphones, digital microphones, speakers, pressure sensors or ultrasonic transducers. The device may be at least one of: a portable device; a battery power device; a computing device; a communications device; a gaming device; a mobile telephone; an earphone or in-ear hearing aid, a personal media player; a laptop, tablet or notebook computing device.

The invention may also be used in a number of applications, including, but not limited to, consumer applications, medical applications, industrial applications and automotive applications. For example, typical consumer applications include portable audio players, wearable devices, laptops, mobile phones, PDAs and personal computers. Examples may also be used in voice activated or voice controlled devices. Typical medical applications include hearing aids. Typical industrial applications include active noise cancellation. Typical automotive applications include hands-free sets, acoustic crash sensors and active noise cancellation.

It should be noted that the above-mentioned examples illustrate rather than limit the invention, and that those skilled in the art will be able to design many alternative configurations without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference signs in the claims shall not be construed so as to limit their scope.

The invention claimed is:

1. A MEMS transducer comprising:
a flexible membrane, the flexible membrane comprising a conductive track; and
a continuity testing circuit electrically connected to the conductive track, wherein the conductive track is electrically isolated from any further conductive regions of the flexible membrane, and
wherein the continuity testing circuit is configured to test the continuity of the conductive track;
wherein:
the MEMS transducer further comprises a substrate;
the flexible membrane is attached to the substrate;
the conductive track is located within a perimeter region of the flexible membrane, a mechanical attachment between the flexible membrane and the substrate being located in the perimeter region of the flexible membrane;
the flexible membrane is attached to the substrate at a plurality of supporting edges located in the perimeter region of the flexible membrane, the conductive track being located at each of the supporting edges; and
the plurality of supporting edges alternate around the perimeter of the flexible membrane with a plurality of unfixed edges, the conductive track being located at each of the unfixed edges.

2. The MEMS transducer of claim 1, wherein the conductive track is electrically connected to the continuity testing circuit at two discrete positions.

3. The MEMS transducer of claim 2, wherein the conductive track is divided into a plurality of conductive track portions, each conductive track portion being electrically connected to the continuity testing circuit.

4. The MEMS transducer of claim 3, wherein each of the conductive track portions is electrically isolated from the other conductive track portions from among the plurality of conductive track portions.

5. The MEMS transducer of claim 1, wherein:
the perimeter region of the flexible membrane is supported on a plurality of mount structures, the plurality of mount structures being configured to restrict the movement of the flexible membrane with respect to the substrate; and
the conductive track is configured to substantially encircle a mount structure from among the plurality of mount structures.

6. The MEMS transducer of claim 1, wherein:
the perimeter region of the flexible membrane comprises a plurality of spring portions separated by perforations in the flexible membrane; and
the conductive track is configured to follow a serpentine path along and around the spring portions.

7. The MEMS transducer of claim 1, wherein the continuity testing circuit is a current sensing circuit or wherein the continuity testing circuit is a voltage sensing circuit.

8. The MEMS transducer of claim 1, wherein the conductive track is formed substantially from metal.

9. The MEMS transducer of claim 1 wherein:
the flexible membrane comprises a dispersed layer located on a surface of the flexible membrane, a portion of the dispersed layer being configured to act as a membrane electrode in a capacitive system; and
the conductive track is formed from a further portion of the dispersed layer that is electrically isolated from the portion of the dispersed layer configured to act as the membrane electrode in the capacitive system.

10. The MEMS transducer of claim 1, wherein:
the MEMS transducer comprises a back plate portion, the back plate portion comprising a back plate electrode; and
the conductive track is electrically isolated from the back plate electrode.

11. The MEMS transducer of claim 1, wherein the continuity testing circuit is configured to perform a continuity test of the conductive track upon activation of the MEMS transducer.

12. The MEMS transducer of claim 1, wherein the continuity testing circuit is configured to perform continuity tests of the conductive track periodically while the MEMS transducer is active.

13. The MEMS transducer of claim 1, wherein the continuity testing circuit is configured to continuously test the continuity of the conductive track while the MEMS transducer is active.

14. A MEMS transducer comprising a flexible membrane, the flexible membrane comprising a conductive track,
wherein the conductive track is electrically isolated from any further conductive regions of the flexible membrane, and
wherein the conductive track is electrically connected to a plurality of bond pads, the bond pads being for connection to a continuity testing circuit; and
wherein:
the MEMS transducer further comprises a substrate;
the flexible membrane is attached to the substrate;
the conductive track is located within a perimeter region of the flexible membrane, a mechanical attachment between the flexible membrane and the substrate being located in the perimeter region of the flexible membrane;
the flexible membrane is attached to the substrate at a plurality of supporting edges located in the perimeter region of the flexible membrane, the conductive track being located at each of the supporting edges; and
the plurality of supporting edges alternate around the perimeter of the flexible membrane with a plurality of unfixed edges, the conductive track being located at each of the unfixed edges.

15. A method for testing the status of a flexible membrane of a MEMS transducer, the flexible membrane comprising a conductive track, the MEMS transducer further comprising a continuity testing circuit electrically connected to the conductive track, wherein the conductive track is electrically isolated from any further conductive regions of the flexible membrane, and wherein the continuity testing circuit is configured to test the continuity of the conductive track, wherein: the MEMS transducer further comprises a substrate; the flexible membrane is attached to the substrate; the conductive track is located within a perimeter region of the flexible membrane, a mechanical attachment between the flexible membrane and the substrate being located in the perimeter region of the flexible membrane; the flexible membrane is attached to the substrate at a plurality of supporting edges located in the perimeter region of the flexible membrane, the conductive track being located at each of the supporting edges; and the plurality of supporting edges alternate around the perimeter of the flexible membrane with a plurality of unfixed edges, the conductive track being located at each of the unfixed edges, the method comprising:

sending an electrical current along the conductive track using the continuity testing circuit; and evaluating the properties of the electrical current using the continuity testing circuit to test the continuity of the conductive track, wherein the continuity of the conductive track indicates the status of the flexible membrane.

\* \* \* \* \*